(12) United States Patent
Yoshida et al.

(10) Patent No.: US 7,589,587 B2
(45) Date of Patent: Sep. 15, 2009

(54) FEEDBACK AMPLIFIER CIRCUIT OPERABLE AT LOW VOLTAGE BY UTILIZING SWITCHED OPERATIONAL AMPLIFIER AND CHOPPER MODULATOR

(75) Inventors: Takeshi Yoshida, Hiroshima (JP);
Yoshihiro Masui, Hiroshima (JP);
Atsushi Iwata, Hiroshima (JP);
Kunihiko Gotoh, Kanagawa (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 88 days.

(21) Appl. No.: 11/896,899

(22) Filed: Sep. 6, 2007

(65) Prior Publication Data
US 2008/0106330 A1    May 8, 2008

(30) Foreign Application Priority Data
Sep. 7, 2006    (JP)    ............................. 2006-242728

(51) Int. Cl.
*H03F 1/02* (2006.01)
(52) U.S. Cl. .......................................... 330/9; 330/258
(58) Field of Classification Search ..................... 330/9, 330/258; 327/124, 307
See application file for complete search history.

(56) References Cited

U.S. PATENT DOCUMENTS

| | | | |
|---|---|---|---|
| 4,429,281 A | 1/1984 | Ito et al. | 330/9 |
| 4,628,274 A | 12/1986 | Vittoz et al. | 330/9 |
| 5,477,481 A * | 12/1995 | Kerth | 708/819 |
| 6,169,771 B1 | 1/2001 | Shou et al. | 375/343 |
| 7,336,123 B2 * | 2/2008 | Yoshida et al. | 330/9 |
| 7,446,602 B2 * | 11/2008 | Yoshikawa | 330/9 |

FOREIGN PATENT DOCUMENTS

| | | |
|---|---|---|
| JP | 56-85436 | 12/1979 |
| JP | 59-148413 | 8/1984 |

(Continued)

OTHER PUBLICATIONS

K. D. Wise, "Wireless Implantable MicroSystems: Coming Breakthroughs in Health Care", Symposium on VLSI Circuits Digest of Technical Papers, pp. 106-109, Jun. 2002.

(Continued)

*Primary Examiner*—Khanh V Nguyen
(74) *Attorney, Agent, or Firm*—Wenderoth, Lind & Ponack, L.L.P.

(57) ABSTRACT

In a feedback amplifier circuit, a first switching device executes an auto-zero operation by inputting a signal outputted from an amplifier to an input terminal of the amplifier during an auto-zero operation interval prior to an amplification interval. A first capacitor accumulates and holds an offset voltage at the output terminal of the amplifier during the auto-zero operation interval, and cancels an offset voltage at the input terminal of the amplifier by an accumulated and held offset voltage during an amplification interval subsequent to the auto-zero operation interval. A second switching device grounds the feedback point of the feedback circuit during the auto-zero operation interval. A second capacitor blocks a DC voltage, and accumulates and holds an offset voltage at an output terminal of the amplifier, and cancels an offset voltage at an input terminal of the amplifier by the accumulated and held offset voltage during an amplification interval.

6 Claims, 17 Drawing Sheets

FOREIGN PATENT DOCUMENTS

| JP | 59-163903 | 9/1984 |
|----|-----------|--------|
| JP | 60-239110 | 11/1985 |
| JP | 10-256873 | 9/1998 |
| JP | 2001-77640 | 3/2001 |

OTHER PUBLICATIONS

T. Yoshida et al., "A Design of Neural Signal Sensing LSI with Multi-Input-Channels", IEICE Transactions Fundamentals, vol. E87-A, No. 2, pp. 376-383, Feb. 2004.

C. C. Enz et al., "Circuit Techniques for Reducing the Effects of Op-Amp Imperfections: Autozeroing, Correlated Double Sampling, and Chopper Stabilization", Proceedings of the IEEE, vol. 84, No. 11, pp. 1584-1614, Nov. 1996.

A. T. K. Tang, "A 3 μV-Offset Operational Amplifier with 20nV/√Hz Input Noise PSD at DC Employing both Chopping and Autozeroing", ISSCC Digest of Technical Papers, pp. 386-387, Feb. 2002.

A. M. Abo et al., "A 1.5-V, 10-bit 14.3-MS/s CMOS Pipeline Analog-to-Digital Converter", Journal of Solid State Circuits, vol. 34, No. 5, pp. 599-606, May 1999.

V. Cheung et al., "A 1V CMOS Switched-Opamp Switched-Capacitor Pseudo-2-Path Filter", ISSCC Digest of Technical Papers, pp. 154-155, Feb. 2000.

Q. Huang, C. Menolfi, "A 200nV offset 6.5nV/√Hz Noise PSD 5.6 kHz Chopper Instrumentation Amplifier in 1 μm Digital CMOS", ISSCC Digest of Technical Papers, pp. 362-363, Feb. 2001.

J. F. Duque-Carrillo et al., "1-V Rail-to-Rail Operational Amplifiers in Standard CMOS Technology", Journal of Solid State Circuits, vol. 35, No. 1, pp. 33-34, Jan. 2000.

T. Yoshida, "A 1V Supply 50 nV/√(Hz) Noise PSD CMOS Amplifier Using Noise Reduction Technique of Autozeroing and Chopper Stabilization", Symposium on VLSI, pp. 118-121, 2005.

\* cited by examiner

Fig.12

| | PRESENT IMPLEMENTAL EXAMPLE | NON-PATENT DOCUMENT 9 | NON-PATENT DOCUMENT 4 | NON-PATENT DOCUMENT 8 |
|---|---|---|---|---|
| PUBLICATION YEAR | 2006 | 2005 | 2002 | 2000 |
| SUPPLY VOLTAGE (V) | 0.6 | 1.0 | 5.0 | 1.0 |
| AUTO-ZERO OPERATION FREQUENCY (kHz) | <0.001 | <0.001 | 7.5 | — |
| CHOPPING FREQUENCY (kHz) | 1000 | 1000 | 15 | — |
| PSD (nV/√Hz) OF INPUT NOISE AT 1kHz | 89 | 50 | 20 | 360 |
| POWER CONSUMPTION (mW) | 0.13 | 0.5 | 4.0 | 0.2 |
| CHIP AREA (mm$^2$) | 0.205 | 0.88 | 0.67 | 0.81 |
| UNITY GAIN BANDWIDTH (MHz) | 10.0 | 20.2 | 2.5 | 2.1 |
| FOM (×10$^3$) | 421 | 45 | 18.7 | 17.1 |

OFFSET CANCELLATION DURING
AUTO-ZERO OPERATION INTERVAL

US 7,589,587 B2

FEEDBACK AMPLIFIER CIRCUIT OPERABLE AT LOW VOLTAGE BY UTILIZING SWITCHED OPERATIONAL AMPLIFIER AND CHOPPER MODULATOR

BACKGROUND OF THE INVENTION

1. Field of the Invention

The present invention relates to a feedback amplifier circuit, and in particular, to a feedback amplifier circuit which is formed by, for example, a CMOS circuit, is constituted by utilizing a switched operational amplifier and a chopper modulator, and is operable at a low voltage.

2. Description of the Related Art

Recently, a sensor chip employing a mixed signal CMOS technique has been applied to detection and monitoring of a biological function (See, e.g., Non-Patent Documents 1 and 2). A low noise amplifier is one of the most important circuits in the sensor chip, since the sensor chip detects a low-level signal. However, in the scaled CMOS technique, increase in a direct-current (DC) offset voltage and increase in a low frequency (1/f) noise lead to a serious problem.

The auto-zero operation and chopper stabilization are techniques widely used to reduce these noises (See, e.g., Non-Patent Document 3). The principles of these techniques are shown in FIGS. 13 to 18. FIG. 13 is a circuit diagram showing a configuration of an operational amplifier circuit including an auto-zero operational circuit which is one of principles of noise reduction techniques according to a prior art. FIG. 14 is a timing chart showing control signals φ1 and φ2 for use in the operational amplifier circuit of FIG. 13 for offset cancellation.

Referring to FIG. 13, the operational amplifier circuit including the auto-zero operational circuit is constituted by including a differential operational amplifier 50, an operational amplifier 51, a sample-hold circuit 52 and an adder 53 for forming the auto-zero operational circuit, an adder 54 for equivalently considering a DC offset Voff and a 1/f noise Vfn at zero input, and four switches 55 to 58 operating in response to the control signals φ1 and φ2 for the offset cancellation.

Referring to FIG. 14, the control signal φ2 has a high level only during an offset cancellation interval, and the control signal φ1 becomes the high level from a low level after the end of the offset cancellation interval. According to the auto-zero operation technique, noises such as the DC offset Voff and the 1/f noise Vfn at zero input are sampled, and thereafter, a noise effect caused by a feedback is subtracted from an input signal by the auto-zero operational circuit constituted by the operational amplifier 51, the sample-hold circuit 52, and the adder 53. The auto-zero operation technique thus makes it possible to reduce the low-frequency noises of the amplifier circuit, however, one problem of the auto-zero operation technique is to increase in a baseband noise floor caused by aliasing of a broadband noise unique to a sampling process.

FIG. 15 is a circuit diagram showing a configuration of a chopper amplifier circuit of an operational amplifier including a chopper stabilizing circuit, which is one of the principles of noise reduction techniques according to the prior art. FIG. 16 is a timing chart showing control signals φ1 and φ2 for use in the operational amplifier circuit of FIG. 15 for chopper modulation and chopper demodulation. Referring to FIG. 16, the control signals φ1 and φ2 have a predetermined chopper frequency fc and are complementary to each other. In this case, a chopper cycle Tc is a reciprocal of the chopper frequency fc. In addition, FIG. 17 is a diagram showing a frequency characteristic of an input voltage signal Vin(f) inputted to the chopper amplifier circuit of FIG. 15, FIG. 18 is a diagram showing a frequency characteristic of an input voltage signal V(f) inputted to an operational amplifier 60 of the chopper amplifier circuit of FIG. 15, and FIG. 19 is a diagram showing a frequency characteristic of an output voltage signal Vout(f) outputted from a chopper demodulator 62 of the chopper amplifier circuit of FIG. 15, and a frequency characteristic of an output voltage signal outputted from a low-pass filter 63.

Referring to FIG. 15, the chopper amplifier circuit is constituted by including a differential operational amplifier 60, a chopper modulator 61 which is provided at the previous stage of the operational amplifier 60 and constituted by four switches 71 to 74, an adder 64 which is provided at the previous stage of the operational amplifier 60 for equivalently considering the DC offset Voff and the 1/f noise Vfn, the chopper demodulator 62 which is provided at the subsequent stage of the operational amplifier 60 and constituted by four switches 81 to 84, and the low-pass filter 63 which is provided at the subsequent stage of the chopper demodulator 62 and inserted at a final stage of the chopper amplifier circuit for extracting a desired input signal. According to the chopper stabilization based on a modulation technique, a chopper-modulated signal is obtained by converting a frequency range of an input signal having a frequency spectrum of FIG. 17 into a higher frequency range by the chopper modulator 61 (See FIG. 18). The DC offset Voff and the 1/f noise Vfn are added to the chopper-modulated signal at the previous stage of the operational amplifier 60. A resultant chopper-modulated signal is amplified by the operational amplifier 60, is chopper-demodulated by the chopper demodulator 62, and is processed by the low-pass filter 63 so as to obtain an input signal that is an original baseband signal (See FIG. 19). It is noted that a level of the 1/f noise Vfn is smaller than that of a thermal noise. In the chopper amplifier circuit, a large energy due to the low-frequency noise is generated by the chopper modulation using the chopping frequency fc, however, a cleaner output signal can be obtained by using the low-pass filter 63 employed in the chopper stabilization technique.

A combination of the auto-zero operation technique and the chopper stabilization technique can contribute to reduce the baseband noise floor and modulation noise at the chopper frequency, since the auto-zero operation eliminates the DC offset and the chopper stabilization reduces the baseband noise (See, e.g., Non-Patent Document 4).

The above-mentioned two techniques are required for a low noise amplifier operating at a low voltage, however, it is difficult to apply the two techniques to the low noise amplifier by utilizing an ordinary analog switch. The reason for the difficulty is that the analog switch cannot transmit an intermediate voltage level by using a low power source voltage. In order to solve this problem of the analog switch, a clock signal boosting technique (See, e.g., Non-Patent Document 5) and a switched operational amplifier technique (See, e.g., Non-Patent Document 6) have been developed. The above-mentioned reason will be described below in detail with reference to FIGS. 20 and 21.

FIG. 20 is a circuit diagram showing a configuration of a CMOS analog switch circuit according to a prior art. FIG. 21 is a graph showing operation of the CMOS analog switch circuit of FIG. 20 and conductances Gp and Gn of respective MOSFETs P101 and N101 with respect to an input voltage Vin. The conductance Gp of the P channel MOSFET P101 and the conductance Gn of the N channel MOSFET N101, which constitute the CMOS analog switch of FIG. 20, decrease at the input voltage near Vdd/2 even in an ON-state when a power source voltage Vdd is reduced to, for example, one volt, and this leads to that the analog switch cannot be turned on. Under these conditions, there was such a problem that it was difficult to realize an electronic circuit utilizing the analog switch such as an A/D converter, a D/A converter or a DC amplifier circuit.

Namely, in recent fine CMOS processing, the power source voltage Vdd is gradually made lower according to a device scaling law, however, a threshold voltage Vth of a CMOS device is not made lower in order to reduce the power consumption during standby of a large-scaled digital circuit. For example, in a CMOS process with the power source voltage Vdd of 1.0 V and the threshold voltage Vth of 0.5 V, a floating analog switch is put into an off-state when the input signal has an intermediate electric potential, and then, a chopper circuit for switching over among signal paths cannot be realized (See FIGS. 20 and 21). In order to realize the analog switch operating even at a low power source voltage, there have been a boot-strapping technique for boosting a gate voltage of a transistor and a low threshold voltage device for use in analog circuits. However, in the former case, such a device is required that has a withstand voltage higher than that of an ordinary device, and this causes problems such as complication of process, deterioration in reliability, and an increase in circuit area. In addition, in the latter case, there are problems of an increase in a leakage current and deterioration in reliability.

With a view to solving the above-described problems, Non-Patent Document 8 discloses a chopper amplifier circuit which is more simple in circuit construction than the prior arts, has also higher reliability and is operable at a low voltage.

FIG. 22 is a circuit diagram showing a configuration of a chopper amplifier circuit according to a prior art. FIG. 23 is a timing chart showing control signals $\phi 0$, $\phi 1$ and $\phi 2$ for use in the chopper amplifier circuit of FIG. 22. The chopper amplifier circuit according to this prior art is a low noise amplifier operating at a low power source voltage based on auto-zero operation and chopper stabilization. In a low voltage operation for chopper stabilization, an input voltage level is unstable, and therefore, the chopper modulator 61 and the chopper demodulator 62 according to the prior art cannot be implemented in floating analog switches. In order to solve this problem, the chopper amplifier circuit is characterized by including a switched operational amplifier 3 having a negative feedback as shown in FIG. 22.

Referring to FIG. 22, the chopper amplifier circuit according to the prior art includes a chopper modulator 1, an adder 2, a switched operational amplifier 3 including a chopper demodulator 4 provided at a final stage thereof, a chopper modulator 5 for a negative feedback circuit a low-pass filter 6, an input terminal T1, an intermediate output terminal T2, an output terminal T3, a coupling capacitor C1, a capacitor C2 for the negative feedback circuit, and a switch 7 and a terminal T4 for the auto-zero operation. Referring to FIG. 23, during an offset sampling (which is preferably a time interval of 1 to 5 μsec and executed at a frequency of 1 Hz or lower), or during an auto-zero operation interval, the control signal $\phi 0$ indicating an interval during which the switch 7 is turned on and the control signal $\phi 1$ for the chopper modulation and the chopper demodulation become both a high level, while the control signal $\phi 2$ which is a complementary signal to the control signal $\phi 1$ becomes a low level. Next, in a chopper amplification interval, the control signal $\phi 0$ holds the low level, the control signal $\phi 1$ becomes a repeating rectangular pulse signal, and the control signal $\phi 2$ becomes a repeating rectangular pulse signal which is a complementary signal to the control signal $\phi 1$.

Referring to FIG. 22, an input signal Vin, which is either a DC signal or a low frequency signal inputted to the input terminal T1, is inputted to the chopper modulator 1, which is a multiplier, via the coupling capacitor C1. The chopper modulator 1 multiplies the input signal Vin by the control signal $\phi 1$ (or $\phi 2$), and outputs a chopper-modulated signal indicating a multiplication result to the adder 2. During the offset sampling for the auto-zero operation interval, the adder 2 subtracts an auto-zero operation offset signal, which is fed back via the switch 7 and the terminal T4, from the chopper-modulated signal. In addition, during the chopper amplification interval, the adder 2 subtracts a chopper-modulated signal, which is outputted from the chopper modulator 5 of the negative feedback circuit, from the chopper-modulated signal, and thereafter, the adder 2 outputs a signal indicating a subtraction result to the switched operational amplifier 3.

The switched operational amplifier 3 is constituted by including an input stage, a phase compensation amplifying stage, an auto-zero operation output stage, and the chopper demodulator 4 which is a final stage and which performs chopper demodulation. The switched operational amplifier 3 amplifies an inputted signal while phase-compensating the inputted signal, then chopper-demodulates an amplified signal according to the control signal $\phi 1$ (or $\phi 2$), and outputs an output signal Vout after the chopper demodulation to the low-pass filter 6 via the intermediate output terminal T2. In addition, the switched operational amplifier 3 outputs the output signal Vout to the chopper modulator 5 via the capacitor C2 for the feedback circuit. In this case, the capacitor C2 accumulates and holds a DC offset voltage at an output terminal of the chopper demodulator 4 during the auto-zero operation interval so as to cancel an offset voltage at an input terminal of the switched operational amplifier 3 during the chopper amplification interval after the auto-zero operation interval by the DC offset voltage accumulated and held in the capacitor C2. In addition, an output signal outputted from the auto-zero operation output stage of the switched operational amplifier 3 is fed back to the adder 2 as an auto-zero operation signal Vaz, via the switch 7, which is turned on only during the offset sampling for the auto-zero operation interval, and the terminal T4. The chopper modulator 5 chopper-modulates a feed back signal from the capacitor C2 according to the control signal $\phi 1$ (or $\phi 2$), and thereafter, outputs a resultant signal to the adder 2. Further, the low-pass filter 6 low-pass-filters the output signal Vout inputted thereto via the intermediate output terminal T2 so as to pass therethrough only a desired frequency component of the input signal, and outputs the low-pass-filtered output signal to the terminal T3 as an amplified input signal.

The documents related to the present invention are as follows:

Non-Patent Document 1: K. D. Wise, "Wireless implantable Microsystems: Coming breakthroughs in health care", Symposium on VLSI Circuits Digest of Technical Papers, pp. 106-109, June 2002;

Non-Patent Document 2: T. Yoshida et al., "A design of neural signal sensing LSI with multi-input-channels", IEICE Transactions Fundamentals, Vol. E87-A, No. 2, pp. 376-383, February 2004;

Non-Patent Document 3: C. C. ENZ et al., "Circuit Techniques for Reducing the Effects of Op-Amp Imperfections: Autozeroing, Correlated Double Sampling, and Chopper Stabilization", Proceedings of the IEEE, Vol. 84, No. 11, pp. 1584-1614, November 1996;

Non-Patent Document 4: A. T. K. Tang, "A 3 mV-Offset Operational Amplifier with 20 μV/√(Hz) Input Noise PSD at DC Employing both Chopping and Autozeroing", ISSCC Digest of Technical Papers, pp. 386-387, February 2002;

Non-Patent Document 5: A. M. Abo et al., "A 1.5-V, 10-bit 14.3-MS/s CMOS pipeline analog-to-digital converter", Journal of Solid State Circuits, Vol. 34, No. 5, pp. 599-606, May 1999;

Non-Patent Document 6: V. Cheung et al., "A 1V CMOS Switched-Opamp Switched-Capacitor Pseudo-2-Path Filter", ISSCC Digest of Technical Papers, pp. 154-155, February 2000;

Non-Patent Document 7: Q. Huang, C. Menolfi, "A 200 nV offset 6.5 nV/$\sqrt{(Hz)}$ Noise PSD 5.6 kHz Chopper Instrumentation Amplifier in 1 μm Digital CMOS", ISSCC Digest of Technical Papers, pp. 362-363, February 2001;

Non-Patent Document 8: J. F. Duque-Carrillo et al., "1-V Rail-to-Rail Operational Amplifiers in Standard CMOS Technology", Journal of Solid State Circuits, Vol. 35, No. 1, pp. 33-44, January 2000; and Non-Patent Document 9: T. Yoshida, "A 1V Supply 50 nV/$\sqrt{(Hz)}$ Noise PSD CMOS Amplifier Using Noise Reduction Technique of Autozeroing and Chopper Stabilization", Symposium on VLSI, pp. 118-121, 2005.

However, in the chopper amplifier circuit according to the prior art disclosed in Non-Patent Document 8, since the DC offset voltage of the operational amplifier is held in the capacitors C1, C2, it would be necessary to increase the capacitance value in order to reduce decrease in the hold voltage due to leakage, which would lead to a problem of an increase in the layout area. Also, since the DC offset voltage is present between a pair of virtual grounding points of the fully-differential operational amplifier, there has been a problem of occurrence of an on-resistance of the chopper modulation circuit and clock feed-through mismatch (i.e., when the gate switch is turned on or off, the voltage applied to the gate causes noise to occur on the output side).

SUMMARY OF THE INVENTION

An essential object of the present invention is to provide a feedback amplifier circuit including a switched operational amplifier, which allows an operating point for the operational amplifier to be easily set, and which is further capable of properly canceling and compensating the offset voltage by auto-zero operation.

In order to achieve the aforementioned objective, according to one aspect of the present invention, there is provided a feedback amplifier circuit including an amplifier, a first switching device, a first capacitor, a second switching device, and a second capacitor. The amplifier amplifies an input signal and outputting an amplified signal. The first switching device executes an auto-zero operation by inputting a signal outputted from the amplifier to an input terminal of the amplifier during an auto-zero operation interval prior to an amplification interval. The first capacitor is provided in a feedback circuit interposed between an output terminal of the amplifier and the input terminal of the amplifier, and the first capacitor accumulates and holds an offset voltage at the output terminal of the amplifier during the auto-zero operation interval, and then cancels an offset voltage at the input terminal of the amplifier by an accumulated and held offset voltage during an amplification interval subsequent to the auto-zero operation interval. The second switching device grounds the feedback point of the feedback circuit during the auto-zero operation interval. The second capacitor is inserted between the input terminal of the amplifier and the feedback point of the feedback circuit so as to be connected in series with the first capacitor, and the second capacitor blocks a DC voltage, and accumulates and holds an offset voltage at an output terminal of the amplifier during the auto-zero operation interval, and thereafter cancels an offset voltage at an input terminal of the amplifier by the offset voltage accumulated and held together with the first capacitor during an amplification interval subsequent to the auto-zero operation interval.

The above-mentioned feedback amplifier circuit preferably further includes an analog switch circuit connected at a feedback point of the feedback circuit. The analog switch circuit is turned on and off to constitute a switched capacitor during the amplification interval.

The above-mentioned feedback amplifier circuit preferably further includes a first chopper modulator, a chopper demodulator, and a second chopper modulator. The first chopper modulator chopper-modulates an input signal according to a predetermined control signal and outputs a chopper-modulated signal to the amplifier via the second capacitor. The chopper demodulator is provided at a final stage of the amplifier, and the chopper demodulator chopper-demodulates an amplified chopper-modulated signal according to the control signal, and outputs a demodulated output signal. The second chopper modulator is inserted in the feedback circuit, and the second chopper modulator chopper-modulates a demodulated signal outputted from the chopper demodulator according to the control signal and outputs a chopper-modulated signal to an input terminal of the amplifier via the second capacitor, and this leads to constitution of a chopper amplifier circuit.

The above-mentioned feedback amplifier circuit further includes a low-pass filter for passing therethrough an amplified input signal by low-pass-filtering an output signal outputted from the amplifier so as to pass therethrough a frequency band of the input signal.

In the above-mentioned feedback amplifier circuit, the feedback amplifier circuit is constituted as a fully-differential amplifier circuit. The feedback amplifier circuit further includes a common mode feedback circuit for generating a feedback signal fed back to the input terminal of the amplifier so that a level of the output signal outputted from the amplifier becomes a predetermined reference value in a common mode, based on an output signal outputted from the amplifier.

In the above-mentioned feedback amplifier circuit, the feedback amplifier circuit is formed by a CMOS circuit.

As described above, the feedback amplifier circuit according to the present invention includes the second capacitor which grounds the feedback point of the feedback circuit to block the DC voltage during an auto-zero operation interval and moreover accumulates and holds the offset voltage of the output terminal of the amplifier during the auto-zero operation interval, and thereafter cancels out the offset voltage of the input terminal of the amplifier by the accumulated and held offset voltage together with the first capacitor during an amplification interval subsequent to the auto-zero operation interval. Accordingly, the DC current can be blocked by the second capacitor, the operating points of the amplifier can be freely set, and further, the DC offset voltage at the input terminal of the amplifier can be canceled out during the auto-zero operation interval. Since any decrease in the DC offset voltage due to a leakage current can be compensated only by the second capacitor, the feedback amplifier circuit can be designed independent of the first capacitor of the feedback circuit. Further, since the voltage at the virtual grounding point (above-described feedback point) of the feedback circuit is grounded by the second switching device during the auto-zero interval, there occur neither on-resistances nor mismatch of clock feed-through. Thus, the influences of the DC offset voltage of the amplifier can be eliminated.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 12 is a table showing comparison of the operational amplifier of the present preferred embodiment with operational amplifiers of Non-Patent Documents;

DETAILED DESCRIPTION OF THE PREFERRED EMBODIMENTS

Figure 1:
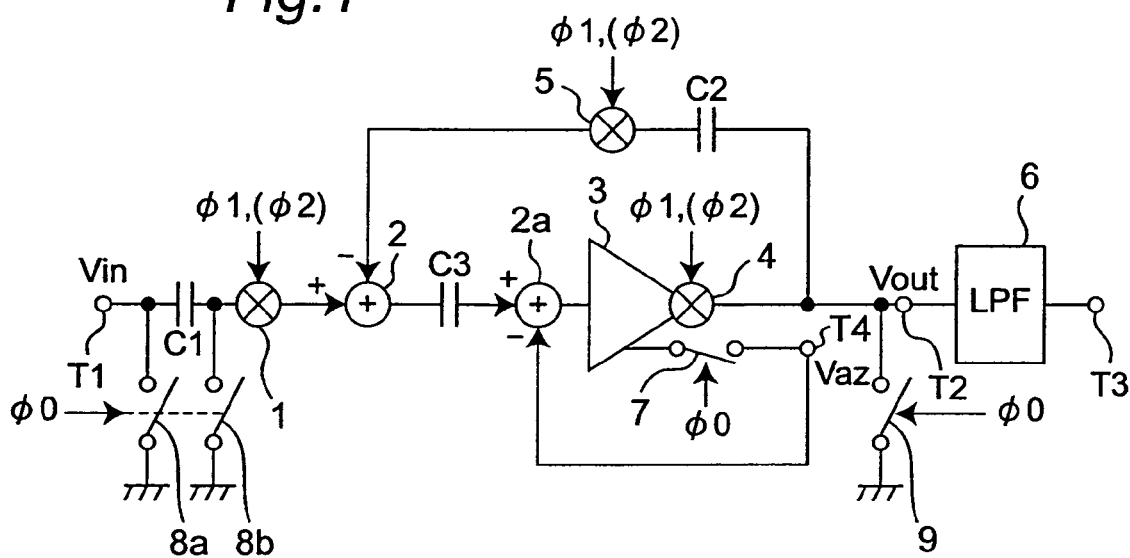
FIG. 1 is a block diagram showing a configuration of a chopper amplifier circuit according to a first preferred embodiment of the present invention.

Preferred embodiments according the present invention will be described below with reference to the drawings. In the following preferred embodiments, the same component parts are designated by the same reference numerals.

First Preferred Embodiment

Figure 2:
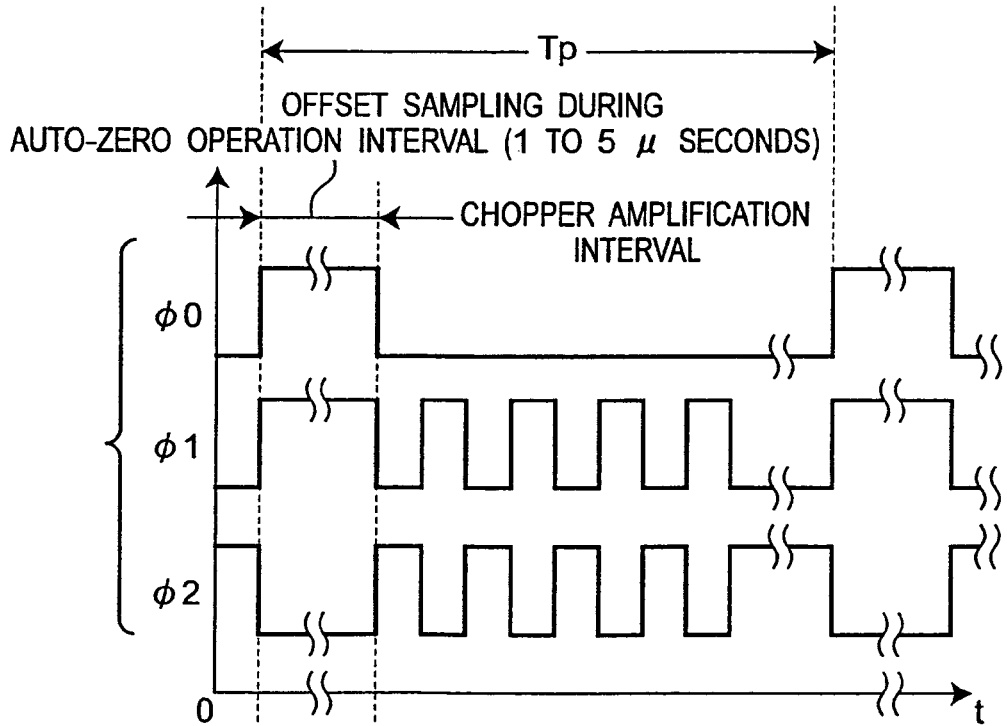
FIG. 2 is a timing chart showing control signals $\phi 0$, $\phi 1$, and $\phi 2$ for use in the chopper amplifier circuit of FIG. 1.
Figure 22:
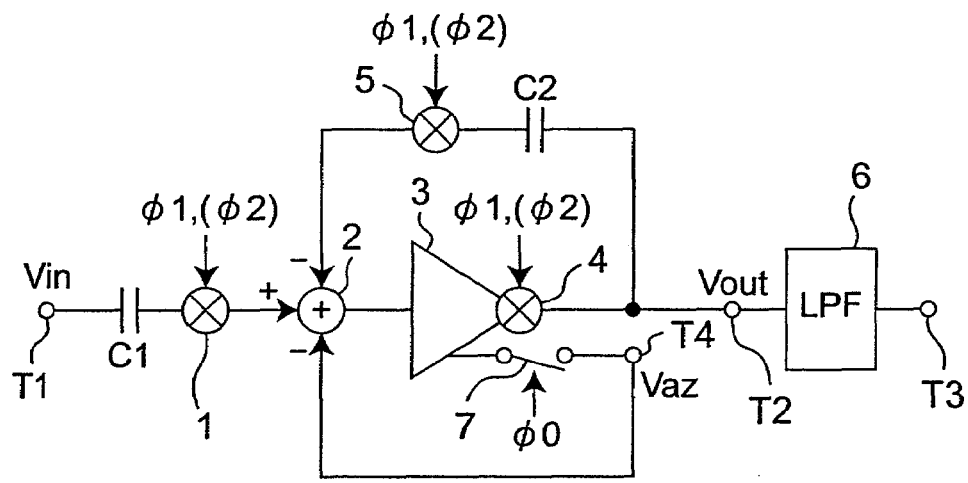
FIG. 22 is a block diagram showing a configuration of a chopper amplifier circuit according to a prior art.
Figure 23:
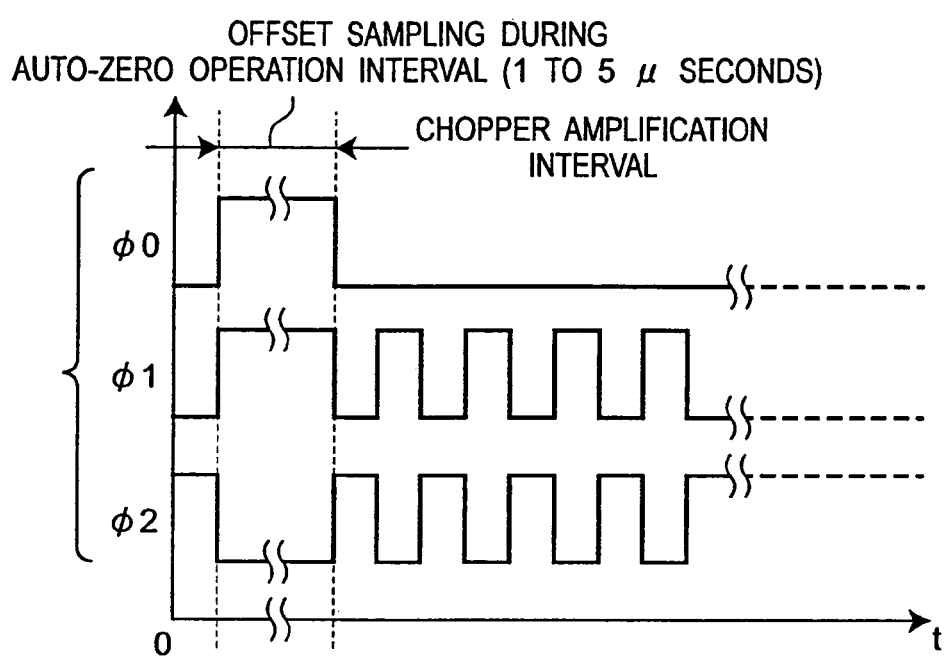
FIG. 23 is a timing chart showing control signals $\phi 0$, $\phi 1$, and $\phi 2$ for use in the chopper amplifier circuit of FIG. 22.

FIG. 1 is a block diagram showing a configuration of a chopper amplifier circuit according to the first preferred embodiment of the present invention. FIG. 2 is a timing chart showing control signals $\phi 0$, $\phi 1$, and $\phi 2$ for use in the chopper amplifier circuit of FIG. 1. The chopper amplifier circuit according to the first preferred embodiment, as compared with the chopper amplifier circuit according to the prior art of FIG. 22, is characterized in that the chopper amplifier circuit includes:

(a) a capacitor C3 for blocking a DC current and compensating any decrease in the DC offset voltage due to a leakage current, and an adder 2a for feeding back an auto-zero operation signal Vaz, both provided between the adder 2 and the input terminal of the switched operational amplifier 3; and (b) switches 8a, 8b and 9 for grounding both ends and an output signal terminal or output terminal T2 of a capacitor C1 during an auto-zero operation interval in which the control signal $\phi 0$ holds a high level.

Referring to FIG. 1, the chopper amplifier circuit according to the first preferred embodiment is constituted by including a chopper modulator 1, adders 2, 2a, the switched operational amplifier 3 including a chopper demodulator 4 provided at a final stage thereof, a chopper modulator 5 for a negative feedback circuit, a low-pass filter 6, an input terminal T1, an intermediate output terminal T2, an output terminal T3, a coupling capacitor C1, a capacitor C2 for the negative feedback circuit, the above-mentioned capacitor C3, and a switch 7 and a terminal T4 for the auto-zero operation. Referring to FIG. 1, during an offset sampling (which is preferably a time interval of 1 to 5 μsec and executed repeatedly at a frequency of 1 Hz or lower), or during an auto-zero operation interval, the control signal $\phi 0$ indicating an interval during which the switch 7 is turned on and the control signal φ1 for the chopper modulation and the chopper demodulation become both a high level, while the control signal φ2 which is a complementary signal to the control signal φ1 becomes a low level. Next, in a chopper amplification interval, the control signal φ0 holds the low level, the control signal φ1 becomes a repeating rectangular pulse signal, and the control signal φ2 becomes a repeating rectangular pulse signal which is a complementary signal to the control signal φ1. In the present preferred embodiment, one of the control signals φ1 and φ2 may be used as a chopper control signal for each of the chopper modulators 1 and 5 and the chopper demodulator 4.

Referring to FIG. 1, an input signal Vin, which is either a DC signal or a low frequency signal inputted to the input terminal T1, is inputted to the chopper modulator 1, which is a multiplier, via the coupling capacitor C1. The chopper modulator 1 multiplies the input signal Vin by the control signal φ1 (or φ2), and outputs a chopper-modulated signal indicating a multiplication result to the adder 2. During the chopper amplification interval, the adder 2 subtracts a chopper-modulated signal, which is outputted from the chopper modulator 5 of the negative feedback circuit, from the chopper-modulated signal, and thereafter, the adder 2 outputs a signal indicating a subtraction result to the adder 2a via the capacitor C3. During the offset sampling for the auto-zero operation interval, the adder 2a subtracts an auto-zero operation offset signal, which is fed back via the switch 7 and the terminal T4, from an inputted chopper-modulated signal, and thereafter, the adder 2a outputs a signal indicating a subtraction result to the input terminal of the switched operational amplifier 3.

The switched operational amplifier 3 is constituted by including an input stage, a phase compensation amplifying stage, an auto-zero operation output stage, and the chopper demodulator 4 which is a final stage and which performs chopper demodulation. The switched operational amplifier 3 amplifies an inputted signal while phase-compensating the inputted signal, then chopper-demodulates an amplified signal according to the control signal φ1 (or φ2), and outputs an output signal Vout after the chopper demodulation to the low-pass filter 6 via the intermediate output terminal T2. In addition, the switched operational amplifier 3 outputs the output signal Vout to the chopper modulator 5 via the capacitor C2 for the feedback circuit. In this case, the capacitors C2 and C3 each accumulate and hold a DC offset voltage at an output terminal of the chopper demodulator 4 during the auto-zero operation interval so as to cancel an offset voltage at an input terminal of the switched operational amplifier 3 during the chopper amplification interval after the auto-zero operation interval by the DC offset voltage accumulated and held in the capacitors C2 and C3. In addition, an output signal outputted from the auto-zero operation output stage of the switched operational amplifier 3 is fed back to the adder 2a as an auto-zero operation signal Vaz, via the switch 7, which is turned on only during the offset sampling for the auto-zero operation interval, and the terminal T4. The chopper modulator 5 chopper-modulates a feed back signal from the capacitor C2 according to the control signal φ1 (or φ2), and thereafter, outputs a resultant signal to the adder 2. Further, the low-pass filter 6 low-pass-filters the output signal Vout inputted thereto via the intermediate output terminal T2 so as to pass therethrough only a desired frequency component of the input signal, and outputs the low-pass-filtered output signal to the terminal T3 as an amplified input signal. It is noted that the respective switches of the chopper modulators 1 and 5 and the chopper demodulator 4 are similar to the switches 71 to 74 and 81 to 84 of FIG. 15, and each of them can be formed by using a CMOS circuit, for example.

According to the chopper amplifier circuit according to this preferred embodiment constituted as described above, the output signal outputted from the chopper demodulator 4 of the switched operational amplifier 3 is chopper-modulated by the chopper modulator 5, and then, is fed back to the input terminal of the switched operational amplifier 3. Accordingly, it is possible to provide a chopper amplifier circuit having a simpler circuit configuration, having a higher reliability, and being operable at a lower voltage. Further, since the chopper amplifier circuit is provided with the auto-zero operation circuit, it is possible to appropriately perform the DC offset on the input signal and reduce the low frequency noise.

Furthermore, in this preferred embodiment, the capacitor C3 capable of independently holding the DC offset voltage of the switched operational amplifier 3 is inserted at a virtual grounding point of the switched operational amplifier 3 (between the adder 2 and the input terminal of the switched operational amplifier 3). A DC current can be blocked by the capacitor C3 by performing an auto-zero operation in the phase of the control signal φ0, an operating point of the switched operational amplifier 3 (an operating point at its input terminal) can be freely set by constituting the switched operational amplifier 3 with a voltage follower circuit, and further, the DC offset voltage at the input terminal of the switched operational amplifier 3 can be canceled during the auto-zero operation interval. Since any decrease in the DC offset voltage due to a leakage current can be compensated only by the capacitor C3, it becomes possible to design the chopper amplifier circuit independent of the feedback capacitors C1 and C2. Further, since the voltage at the virtual grounding point (connecting point of the adder 2) in the feedback loop in the phase of the control signal φ0 is grounded by the switch 8b, there occur neither on-resistances of the chopper modulators 1 and 5 nor mismatch of clock feed-through. Accordingly, the chopper amplifier circuit according to the present preferred embodiment can be provided as a chopper amplifier circuit which has the chopper modulators 1 and 5 at virtual grounding points and which is enabled to eliminate any influences of the DC offset voltage of the switched operational amplifier 3.

Second Preferred Embodiment

Figure 3:
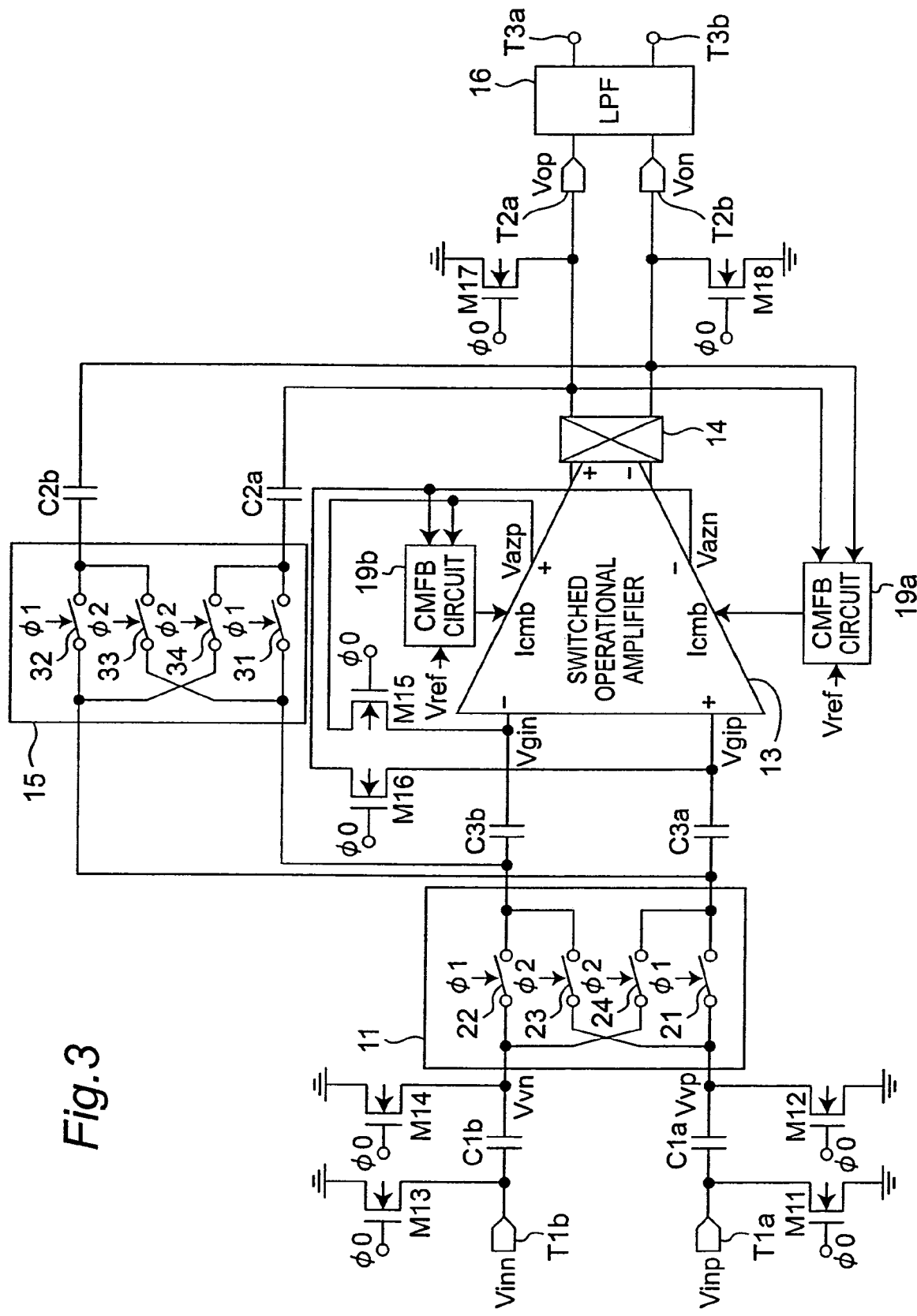
FIG. 3 is a block diagram showing a configuration of a fully-differential chopper amplifier circuit according to a second preferred embodiment of the present invention.

FIG. 3 is a block diagram showing a configuration of a fully-differential chopper amplifier circuit according to the second preferred embodiment of the present invention. Referring to FIG. 3, the chopper amplifier circuit according to the second preferred embodiment is characterized by realizing a chopper amplifier circuit according to the first preferred embodiment of FIG. 1 using a fully-differential amplifier. The present chopper amplifier circuit is constituted by including a chopper modulator 11, a fully differential two-input four-output switched operational amplifier 13 provided with a chopper demodulator 14 at a final stage thereof, a chopper modulator 15 for a negative feedback circuit, a low-pass filter 16, a common mode feedback circuit (referred to as a CMFB circuit hereinafter) 19, input terminals T1a and T1b, intermediate output terminals T2a and T2b, output terminals T3a and T3b, coupling capacitors C1a and C1b, capacitors C2a and C2b for the negative feedback circuit, capacitors C3a and C3b for DC current blocking and auto-zero operation, and transistors M11 to M18 for grounding in auto-zero operation intervals. Referring to FIG. 3, during an offset sampling (which is preferably a time interval of 1 to 5 μsec and executed at a frequency of 1 Hz or lower), or during an auto-zero operation interval, a control signal φ0 indicating an interval during which the transistors M11 to M18 are turned on for grounding and a control signal φ1 for the chopper modulation and the chopper demodulation both become the high level, while a control signal φ2 which is a complementary signal to the control signal φ1 and which serves for chopper modulation and demodulation becomes the low level. Next, in a chopper amplification interval, the control signal φ0 holds the low level, the control signal φ1 becomes a repeating rectangular pulse signal, and the control signal φ2 becomes a repeating rectangular pulse signal which is a complementary signal to the control signal φ1.

Referring to FIG. 3, a positive-side input signal Vinp, which is either a DC signal or a low frequency signal inputted to the input terminal T1a, is inputted to the chopper modulator 11 via the coupling capacitor C1a. On the other hand, a positive-side input signal Vinn, which is either a DC signal or a low frequency signal inputted to the input terminal T1b, is inputted to the chopper modulator 11 via the coupling capacitor C1b. The chopper modulator 11 is constituted by four switches 21 to 24, each of which is turned on and off according to the control signal φ1 or φ2 in a manner similar to that of the prior art. The chopper modulator 11 chopper-modulates inputted differential signals, then outputs a resultant positive-side chopper-modulated signal to a non-inverting input terminal of the switched operational amplifier 13 via the capacitor C3b, and outputs a resultant negative-side chopper-modulated signal to an inverting input terminal of the switched operational amplifier 13 via the capacitor C3a. In addition, both ends of the capacitor C1a are grounded via the transistors M11 and M12 for grounding in auto-zero operation intervals, while both ends of the capacitor C1b are grounded via the transistors M13 and M14 for grounding in auto-zero operation intervals.

Figure 4:
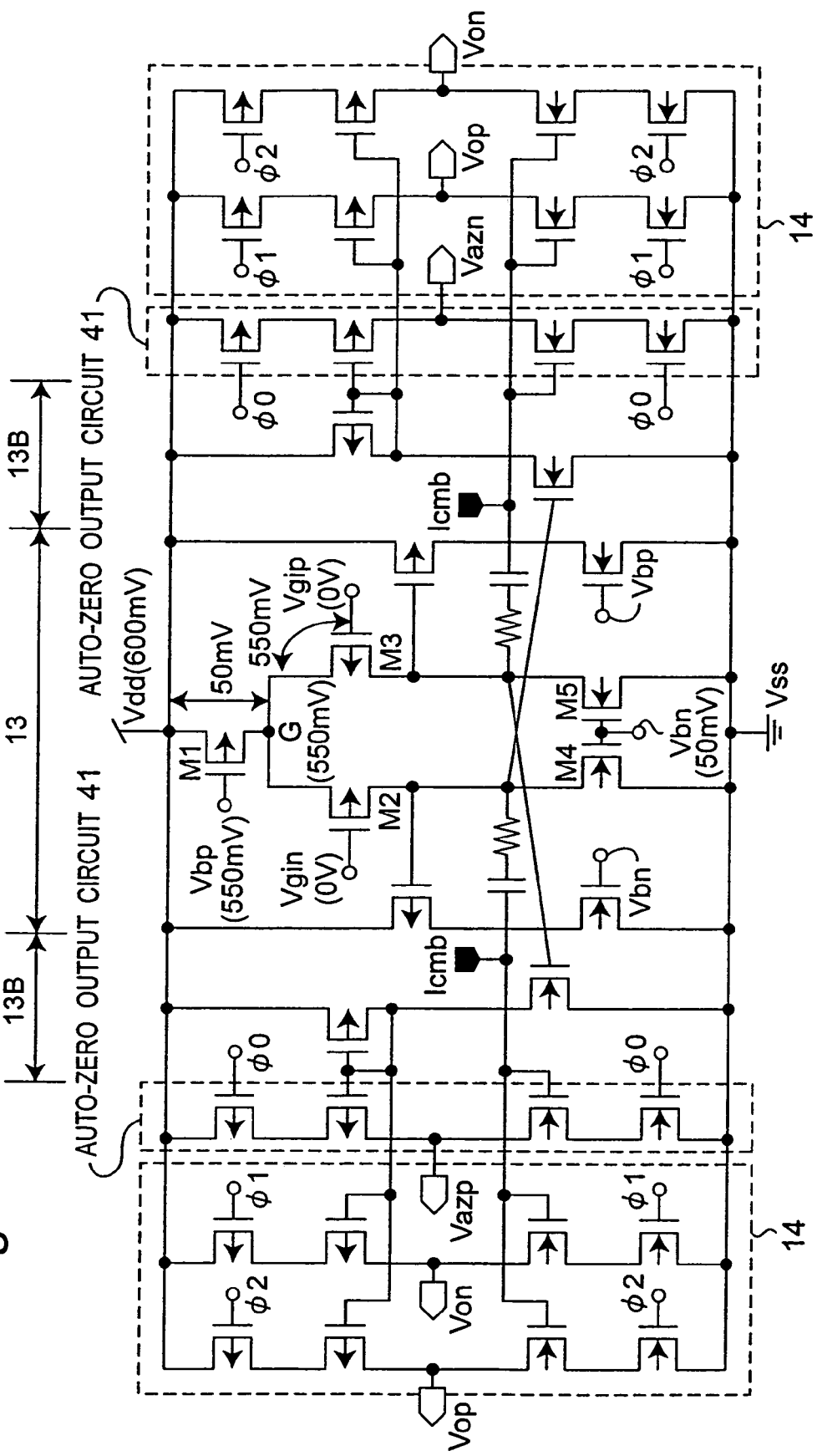
FIG. 4 is a circuit diagram showing a main part circuit including a switched operational amplifier 13, auto-zero output circuits 41, and chopper demodulators 14 of FIG. 3.

As shown in FIG. 4, for example, the switched operational amplifier 13 is constituted by including an input circuit 13A that constitutes an input interface circuit, phase compensation amplifier circuits 13B, auto-zero output circuits 41 and the chopper demodulator 14 for the chopper demodulation provided at the final stage of the switched amplifier 13. The switched operational amplifier 13 inputs inputted signals via the input circuit 13A, amplifies the inputted signals while phase-compensating them by the phase compensation amplifier circuits 13B, and thereafter, chopper-demodulates resultant signals by the chopper demodulator 14 according to the control signals φ1 and φ2. The switched operational amplifier 13 outputs a chopper-demodulated positive-side output signal Vop to the low-pass filter 16 via the intermediate output terminal T2a, and outputs the same signal to the chopper modulator 15 via the capacitor C2a for the feedback circuit. In addition, the switched operational amplifier 13 outputs a chopper-demodulated negative-side output signal Von to the low-pass filter 16 via the intermediate output terminal T2b, and outputs the same signal to the chopper modulator 15 via the capacitor C2b for the feedback circuit. In this case, the chopper demodulator 14 is constituted by four switches, each of which is turned on and off according to the control signals φ1 and φ2 in a manner similar to that of the chopper demodulator 62 of FIG. 15. In addition, the capacitors C2a and C2b accumulate and hold DC offset voltages across output terminals of the chopper demodulator 14, respectively, during the auto-zero operation interval, so as to cancel offset voltages across input terminals of the switched operational amplifier 13 during the chopper amplification interval after the auto-zero operation interval, by the DC offset voltages accumulated and held in the capacitors C2a, C2b, C3a, and C3b, respectively. In addition, the chopper demodulator 14 can realize the chopper demodulating function by making NMOS switches of a CMOS buffer output circuit operating in, for example, a class AB, being switched over between the input signals according to the control signals φ1 and φ2.

In addition, a positive-side output signal outputted from an auto-zero operation output stage of the switched operational amplifier 13 via the switching transistor M15, which is turned on only during the offset sampling or the auto-zero operation interval, is fed back to the inverting input terminal of the switched operational amplifier 13 as an auto-zero operation signal Vazp. In addition, a negative-side output signal outputted from the auto-zero operation output stage of the switched operational amplifier 13 via the switching transistor M16, which is turned on only during the offset sampling or the auto-zero operation interval, is fed back to the non-inverting input terminal of the switched operational amplifier 13 as an auto-zero operation signal Vazn.

Further, the chopper modulator 15 is constituted by four switches 31 to 34, each of which is turned on and off according to the control signal φ1 or φ2 in a manner similar to that of the prior art. The chopper modulator 15 chopper-modulates inputted differential input signals and feeds back resultant signals to the input terminals of the capacitors C3a and C3b, respectively. Namely, the chopper modulator 15 outputs a resultant positive-side chopper-modulated signal to the capacitor C3b on the inverting input terminal side of the switched operational amplifier 13, and outputs a resultant negative-side chopper-modulated signal to the capacitor C3a on the non-inverting input terminal side of the switched operational amplifier 13. Further, the low-pass filter 16 low-pass-filters the differential output signals Vop and Von outputted via the intermediate output terminals T2a and T2b so as to pass therethrough only desired frequency components of input signals, and outputs low-pass-filtered output signals to the terminals T3a and T3b as amplified input signals, respectively.

Further, the CMFB circuit 19a performs the common mode feedback by generating a feedback signal so that a predetermined long-time average of a differential signal of the two differential output signals Vop and Von outputted from the chopper modulator 15 of the switched operational amplifier 13 becomes a predetermined reference voltage Vref based on these differential output signals Vop and Von and the reference voltage Vref, and feeding back a generated feedback signal to an Icmb terminal (See FIG. 4) at an intermediate stage of the switched operational amplifier 13 under current source control. Also, the CMFB circuit 19b performs the common mode feedback by generating a feedback signal so that a predetermined long-time average of a differential signal of a pair of auto-zero output signals Vazp and Vazn becomes a predetermined reference voltage Vref based on these auto-zero output signals and the reference voltage Vref, and feeding back a generated feedback signal to an Icmb terminal (See FIG. 4) at an intermediate stage of the switched operational amplifier 13 under current source control.

Figure 15:
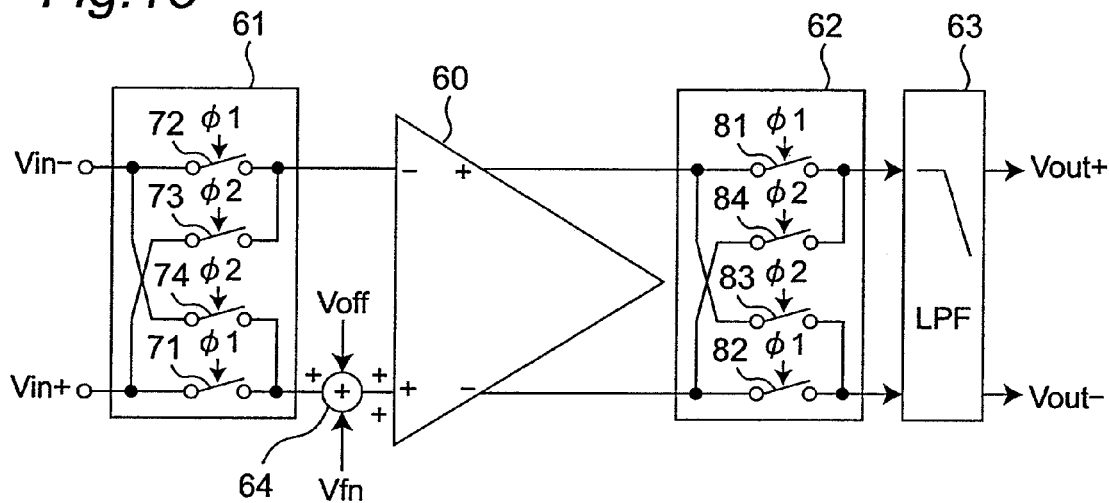
FIG. 15 is a circuit diagram showing a configuration of a chopper amplifier circuit of an operational amplifier including a chopper stabilizing circuit, which is one of the principles of noise reduction techniques according to the prior art.
Figure 16:
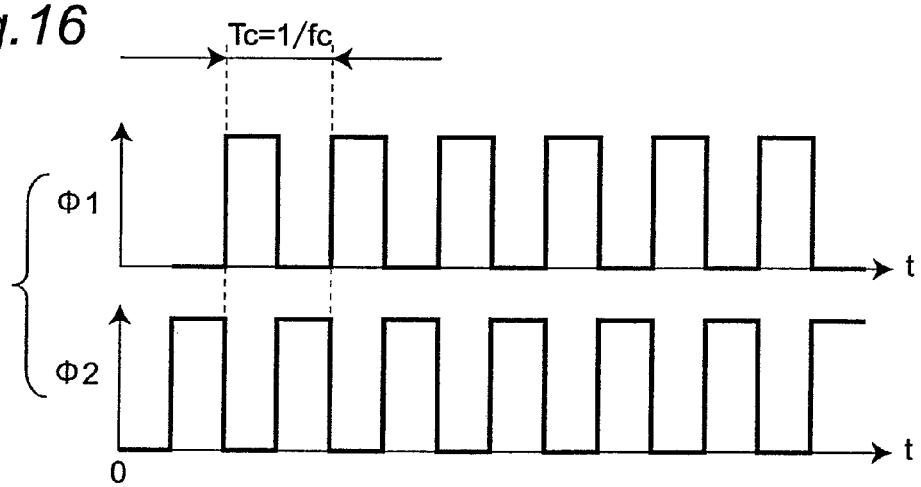
FIG. 16 is a timing chart showing control signals $\phi 1$ and $\phi 2$ for use in the operational amplifier of FIG. 15 for chopper modulation and chopper demodulation.
Figure 17:
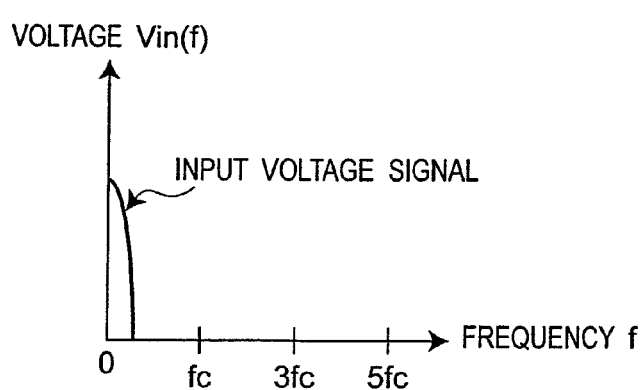
FIG. 17 is a diagram showing a frequency characteristic of an input voltage signal Vin(f) inputted to the chopper amplifier circuit of FIG. 15.
Figure 18:
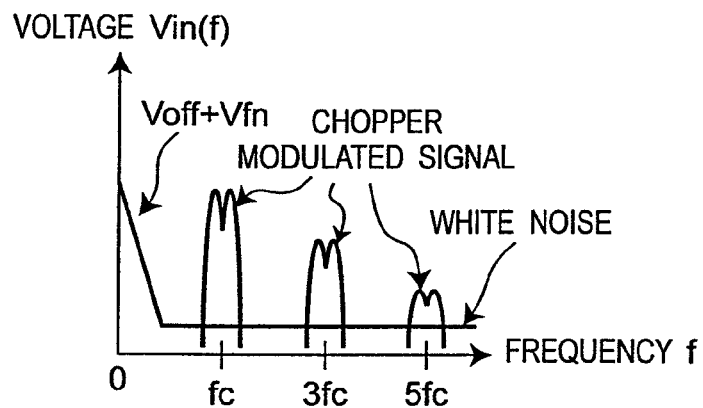
FIG. 18 is a diagram showing a frequency characteristic of an input voltage signal V(f) inputted to an operational amplifier 60 of the chopper amplifier circuit of FIG. 15.
Figure 19:
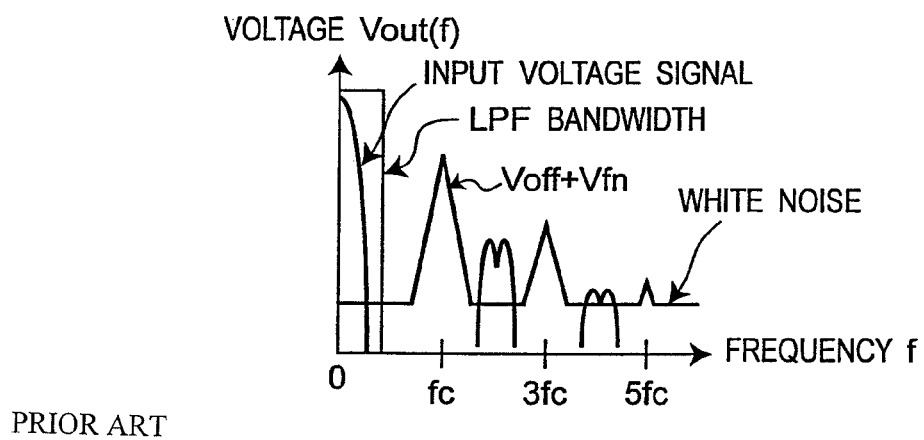
FIG. 19 is a diagram showing a frequency characteristic of an output voltage signal Vout(f) outputted from a chopper demodulator 62 of the chopper amplifier circuit of FIG. 15, and a frequency characteristic of an output voltage signal outputted from a low-pass filter 63.
Figure 20:
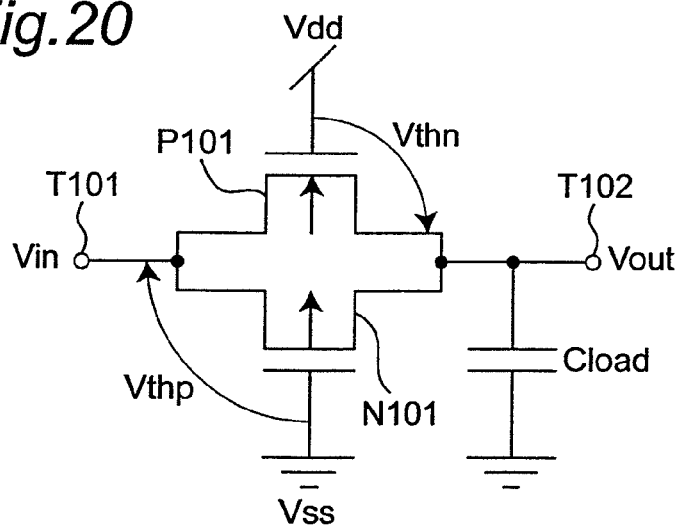
FIG. 20 is a circuit diagram showing a configuration of a CMOS analog switch circuit according to a prior art.

It is noted that the respective switches of the chopper modulators 11 and 15 and the chopper demodulator 14 are those similar to the switches 71 to 74 and 81 to 84 of FIG. 15, and each can be formed by using, for example, an NMOS field effect transistor of a CMOS circuit.

FIG. 4 is a circuit diagram showing a main part circuit including the switched operational amplifier 13, the auto-zero output circuits 41, and the chopper demodulator 14 of FIG. 3. The main part circuit, including an input circuit 13A that constitutes an input interface circuit, phase compensation amplifier circuits 13B, auto-zero output circuits 41 and the chopper demodulator 14 for the chopper demodulation provided at the final stage of the switched amplifier 13, as shown in FIG. 4, is constituted by a CMOS circuit made up of a multiplicity of sets of p-type MOSFETs and n-type MOSFETs as well as phase-compensating resistors and capacitors. A generally left side of FIG. 4 shows a circuit for processing positive-side signals while a generally right side of FIG. 4 shows a circuit for processing negative-side signals.

As described above, in the fully-differential chopper amplifier circuit according to the present preferred embodiment, the chopper modulator 15 or the input part is provided within the feedback loop circuit, and the input voltages Vvp and Vvn at the virtual grounding points rare set to near the grounding electric potential Vss (e.g., 0.25 V) so as to constitute the chopper amplifier circuit using floating analog switches (which are constituted by the NMOS field effect transistors). Since the chopper demodulator 14 of the output circuit having a large signal amplitude cannot be constituted by the analog switches, the chopper demodulator 14 is realized by switching over between outputs from multiple-output switched operational amplifier 13. According to the above described configuration, it is possible to realize the chopper amplifier circuit that reduces the 1/f noise and the DC offset voltage at a relatively low power source voltage at which ordinary analog switches cannot be used. In addition, the chopper amplifier circuit according to the present preferred embodiment has a voltage follower configuration in which the output terminals of the multiple-output switched operational amplifier 13 are connected to the input terminals of the switched operational amplifier 13, and it is also possible to realize the auto-zero operation by holding the DC offset voltages in the respective capacitors C2a and C2b, respectively.

The chopper amplifier circuit according to the second preferred embodiment constituted as described above has such a configuration that the output signals outputted from the chopper demodulator 14 of the switched operational amplifier 13 are chopper-modulated by the chopper modulator 15, and then, are fed back to the respective input terminals of the switched operational amplifier 13. Accordingly, it is possible to provide a chopper amplifier circuit having a simpler circuit configuration, having a higher reliability, and being operable at a lower voltage as compared with those of the prior art. Further, since the chopper amplifier circuit according to the present preferred embodiment is provided with the auto-zero operation circuit, it is possible to appropriately perform the DC offset on the input signal and reduce the low frequency noise.

Furthermore, in the present preferred embodiment, the capacitors C3a, C3b capable of each independently holding the DC offset voltage of the switched operational amplifier 13 are inserted at virtual grounding points (Vvp, Vvn) of the switched operational amplifier 13. DC currents can be blocked by the capacitors C3a and C3b by performing an auto-zero operation in the phase of the control signal φ0, operating points (Vgip, Vgin) of the switched operational amplifier 13 can be freely set by constituting the switched operational amplifier 13 with a voltage follower circuit, and further, the DC offset voltage at the input terminal of the switched operational amplifier 13 can be canceled during the auto-zero operation interval. Since any decrease in the DC offset voltage due to a leakage current can be compensated only by the capacitors C3a and C3b, it becomes possible to design the chopper amplifier circuit independent of the feedback capacitors C1a, C1b, C2a, and C2b. Further, since the voltage at the virtual grounding point (Vvp, Vvn) in the feedback loop in the phase of the control signal φ0 is grounded, there occur neither on-resistances of the chopper modulators 11 and 15 nor mismatch of clock feed-through. Accordingly, the chopper amplifier circuit according to the present preferred embodiment can be provided as a chopper amplifier circuit which has the chopper modulators 11 and 15 at virtual grounding points (Vvp, Vvn) and which is enabled to eliminate any influences of the DC offset voltage of the switched operational amplifier 13.

Next, an implemental example according to the low-voltage-operation low-noise amplifier circuit of FIG. 3 will be expanded below.

Figure 21:
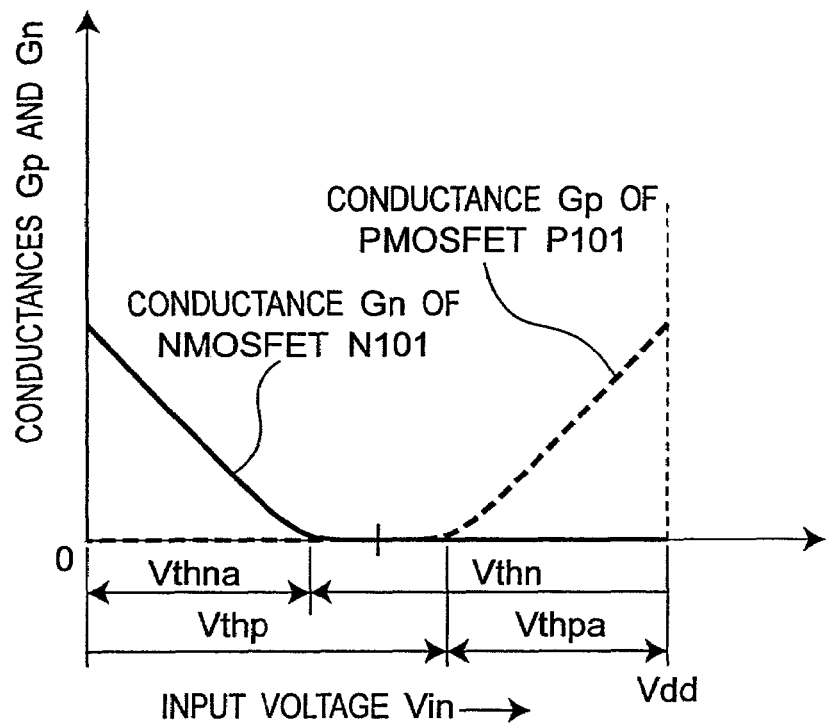
FIG. 21 is a graph showing operation of the CMOS analog switch circuit of FIG. 20 and conductances Gp and Gn of respective MOSFETs P101 and N101 with respect to an input voltage Vin.

For design of a low noise amplifier circuit, it is quite effective to use the auto-zero technique and the chopper stabilization technique in combination (See, e.g., Non-Patent Document 9). In the present preferred embodiment, with the two techniques applied in combination and by an ordinary 0.18-μm CMOS process (thresholds Vthna=0.42 V and Vthp=0.5 V in FIG. 21), limit values of decreased power source voltages were pursued, and a low noise amplifier circuit operable at 0.6 V was designed. Its circuit was formed in a capacitance feedback configuration as shown in FIG. 3, and utilizing the multiple-output switched operational amplifier 13 made it possible to introduce the auto-zero technique. Operation of the output-side chopper demodulator 14 is stopped in the phase of the control signal φ0. In this case, the switched operational amplifier 13 is provided in a voltage follower configuration (operating at output voltages Vop1 and Von1) to detect offset voltages. Detected offset voltages are accumulated in the capacitors C2a, C2b, C3a, and C3b, and the accumulated offset voltages are subtracted from input signals in the phases of the control signals φ1 and φ2 (during the amplifying operation) to compensate relative variations of the devices. Also, the chopper stabilization technique is realized by controlling the three chopper modulators and the like 11, 14, and 15. First of all, the input-side chopper modulator 15 is placed at the virtual grounding points (Vvp, Vvn). Since the signal amplitude at the virtual grounding points (Vvp, Vvn) is small, setting their DC levels to sufficiently low ones makes it possible to realize the chopper modulator 15 by using non-floating analog switches even at a low power source voltage. Large-amplitude floating analog switches are required for the output-side chopper demodulator 14 and, therefore, the output-side chopper demodulator 14 is constituted by the output part of the multiple-output switched operational amplifier 13.

When an amplifier circuit using the fully-differential switched operational amplifier 13 is designed for a low voltage, enough overdrive voltage Vov cannot be ensured so that the voltage gain becomes lower. For this reason, the fully-differential switched operational amplifier 13 is provided in a three-stage configuration. The first-stage circuit for determining the rule for a lowered voltage was so designed that its input part was formed from a p-type MOSFET, and that the overdrive voltage Vov was set to 50 mV. The value of 50 mV is the lowest value at which a MOSFET can operate normally in the saturation region with absolute variations of the devices taken into consideration, and setting the overdrive voltage Vov at 50 mV allows the lowest value for the power source voltage to be determined as 0.6 V. The second stage for obtaining the gain is provided with a phase-compensating RC circuit for applying feedback. The final-stage circuit is constituted by individually biasing n-type MOSFETs and p-type MOSFETs and adding class AB buffer and grounded switches. The common mode level for an output is automatically controlled to 300 mV by feeding back a current-type common mode feedback to the terminal Icmp.

In the chopper amplifier circuit constituted as described above, the input-stage circuit of the switched operational amplifier 13 restricts decreases in the supply voltage. Also, the switched operational amplifier 13 does not need any wide input voltage range, since its inputs are the virtual grounding points. The common mode voltage to be inputted is set to 0 V, and the virtual grounding potential is determined as 0.55 V with a setting of the overdrive voltage to 0.05 V. The power source voltage can be reduced to 0.6 V as shown by the following equation:

$$Vin+Vgs(M2, M3)+Vds(M1)=0.6 \text{ V} \qquad (1).$$

In this case, the input voltage range needs to be set to nearly 0. The output-stage circuit operates at class AB, and the voltage range can be expressed by the following equation:

$$Vss+0.05 \text{ (V)} < \text{Output Voltage Range} < Vdd-0.05 \text{ (V)} \qquad (2).$$

Third Preferred Embodiment

Figure 5:
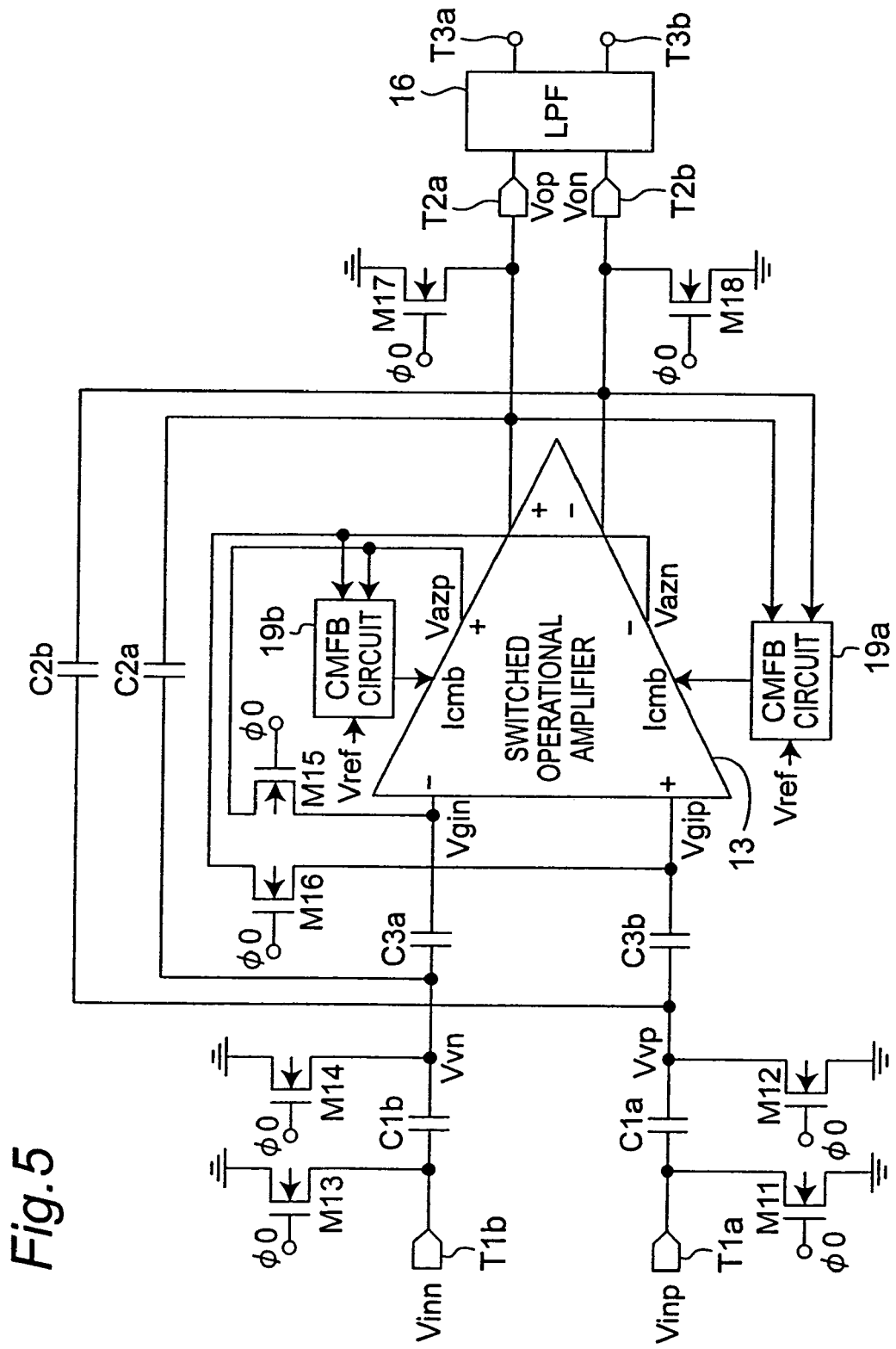
FIG. 5 is a block diagram showing a configuration of a feedback amplifier circuit according to a third preferred embodiment of the present invention.
Figure 6:
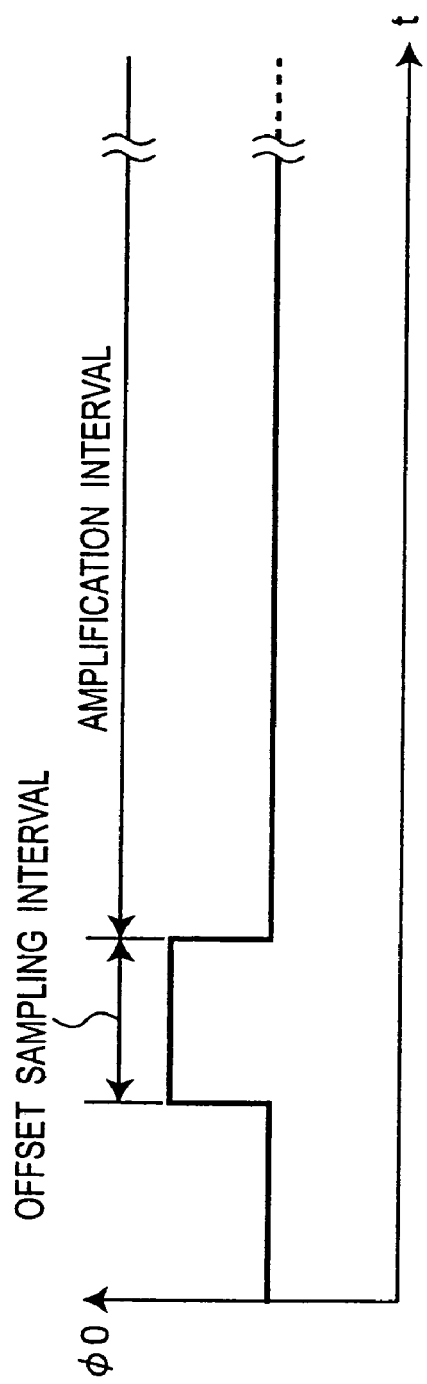
FIG. 6 is a timing chart showing a control signal $\phi 0$ for use in the feedback amplifier circuit of FIG. 5.

FIG. 5 is a block diagram showing a configuration of a feedback amplifier circuit according to a third preferred embodiment of the present invention. FIG. 6 is a timing chart showing a control signal φ0 for use in the feedback amplifier circuit of FIG. 5. The feedback amplifier circuit of FIG. 5, given as an example in which the chopper amplifier circuit of FIG. 3 is applied to a common feedback amplifier circuit, is characterized in that the chopper modulators 11 and 15 and the chopper demodulator 14 are deleted in FIG. 3. In this feedback amplifier circuit, as shown in FIG. 6, signal amplification is performed after each offset sampling interval that is repeated at a predetermined cycle. According to this feedback amplifier circuit, auto-zero capacitors C3 are inserted at virtual grounding points (Vvp, Vvn) of the fully-differential switched operational amplifier 13, so that operating points (Vgip, Vgin) of the switched operational amplifier 13 can be freely set, and moreover that the DC offset voltage of the fully-differential switched operational amplifier 13 can be compensated by the auto-zero operation.

Figure 24:
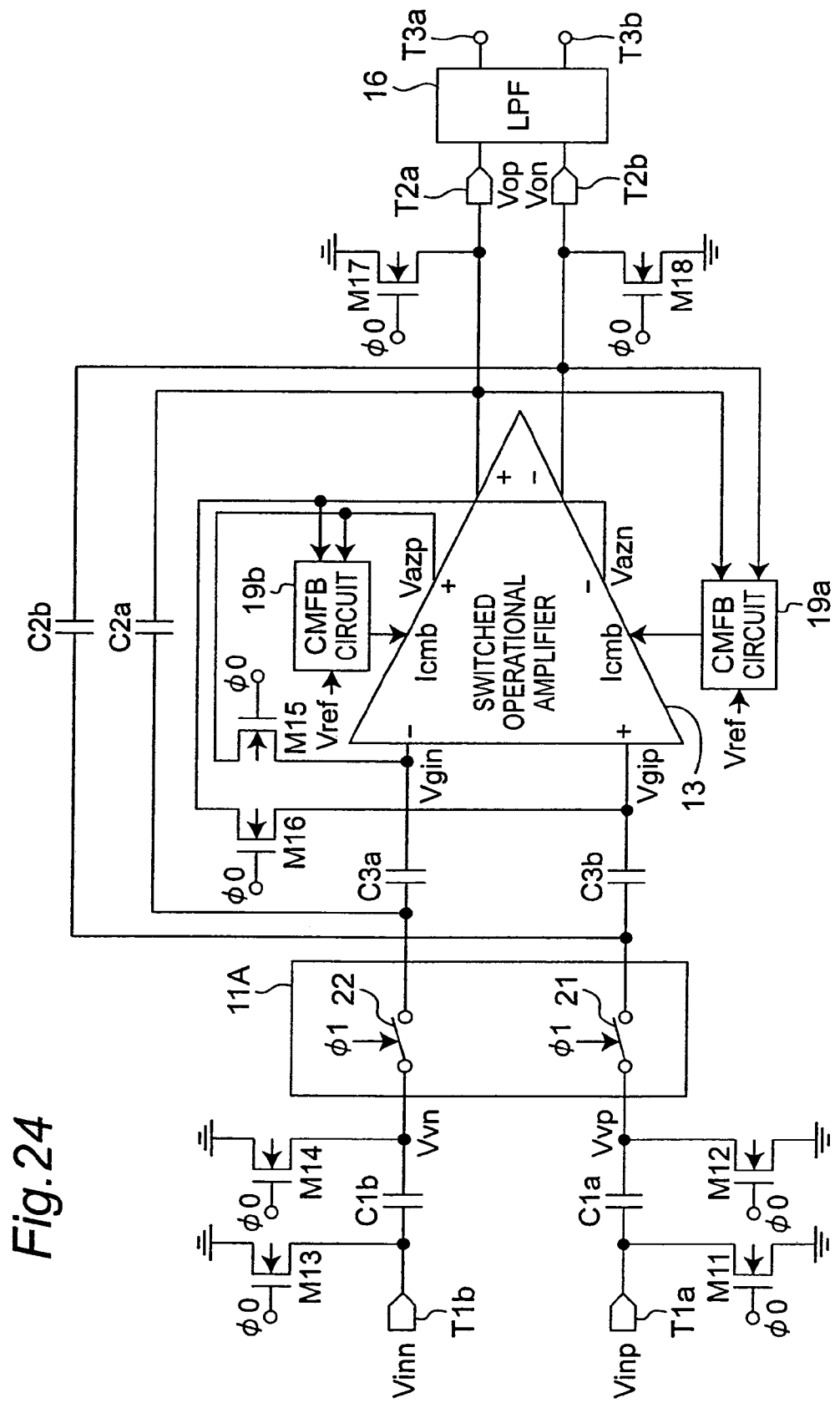
FIG. 24 is a block diagram showing a configuration of a feedback amplifier circuit according to a modification example of the feedback amplifier circuit of FIG. 5.

FIG. 24 is a block diagram showing a configuration of a feedback amplifier circuit according to a modification example of the feedback amplifier circuit of FIG. 5. The feedback amplifier circuit of FIG. 24 is characterized in that an analog switch circuit 11A for constituting a switched capacitor is further provided at the virtual grounding points (Vvp, Vvn) of the fully-differential switched operational amplifier 13, as compared with the feedback amplifier circuit of FIG. 5. In this case, the analog switch circuit 11A includes switches 21 and 22 which are constituted by, for example, NMOS transistors, respectively, and each of which is turned on and off according to the control signal φ1. The switches 21 and 22 are turned on during the auto-zero operation interval, and repeatedly turned on and off at a predetermined cycle during the amplification interval. Thus, a switched capacitor feedback amplifier circuit can be constituted.

IMPLEMENTAL EXAMPLES

Figure 7:
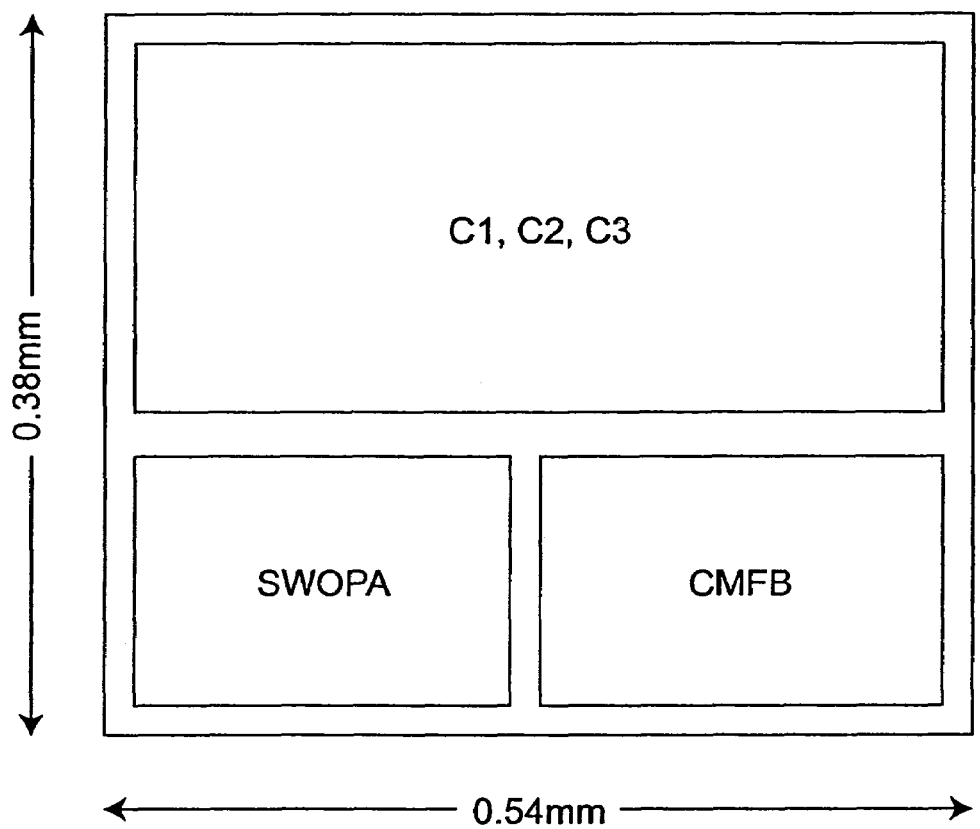
FIG. 7 is a microscopic photograph showing a top surface of the chopper amplifier circuit of FIG. 3 formed on an IC chip.
Figure 8:
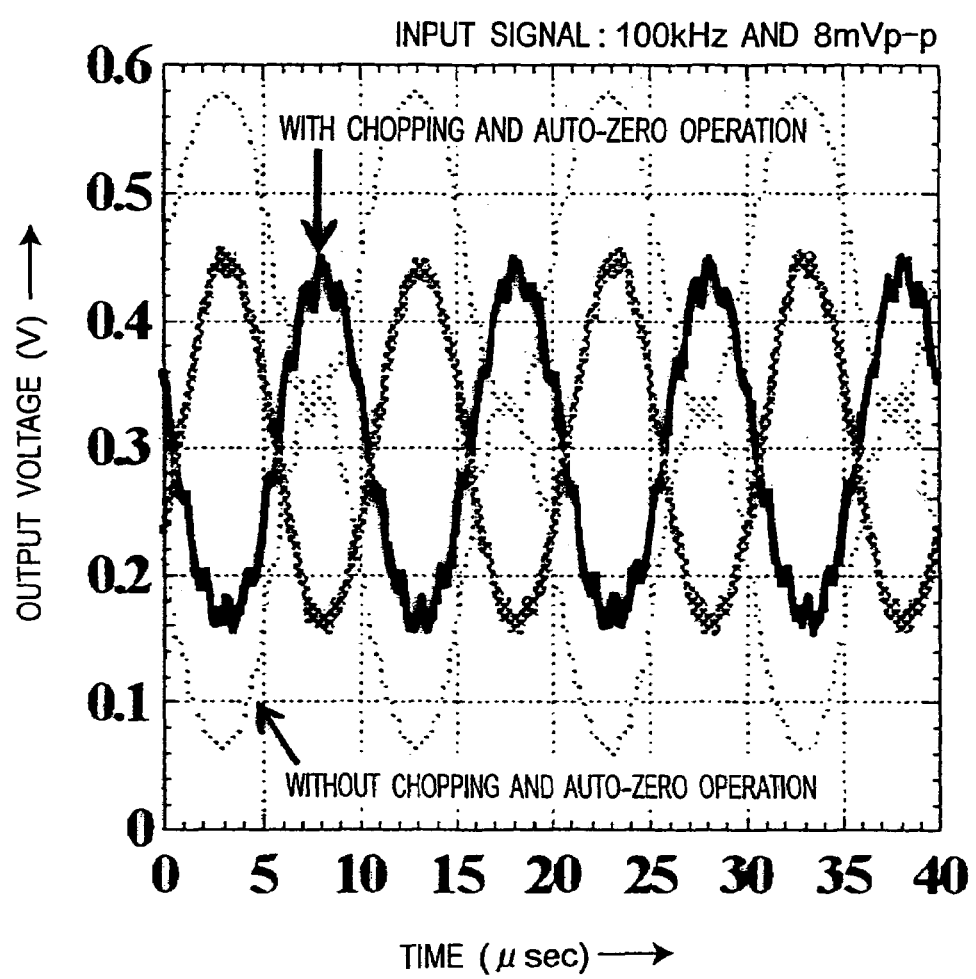
FIG. 8 is a graph showing output voltage waveforms in one case with neither chopping nor auto-zero operation applied and in another case with both chopping and auto-zero operation applied in the chopper amplifier circuit of FIG. 3.
Figure 9:
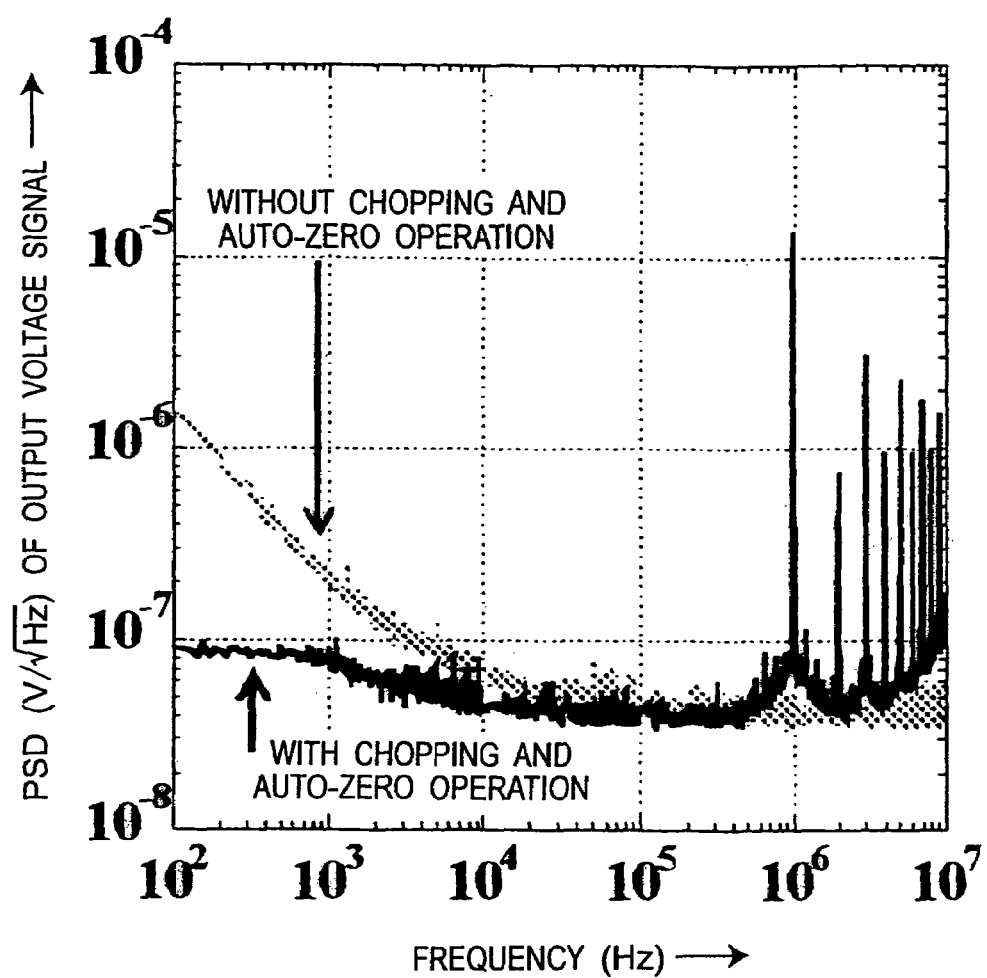
FIG. 9 is a graph showing a frequency characteristic of a power spectral density (PSD) of an input noise with only a switched operational amplifier (with no chopping and no auto-zero operation) for use in the chopper amplifier circuit of FIG. 3, and a frequency characteristic of a power spectral density (PSD) of an input noise in the chopper amplifier circuit (with chopping and auto-zero operation) stabilized by a chopper that operates using a chopping signal of 1 MHz.
Figure 10:
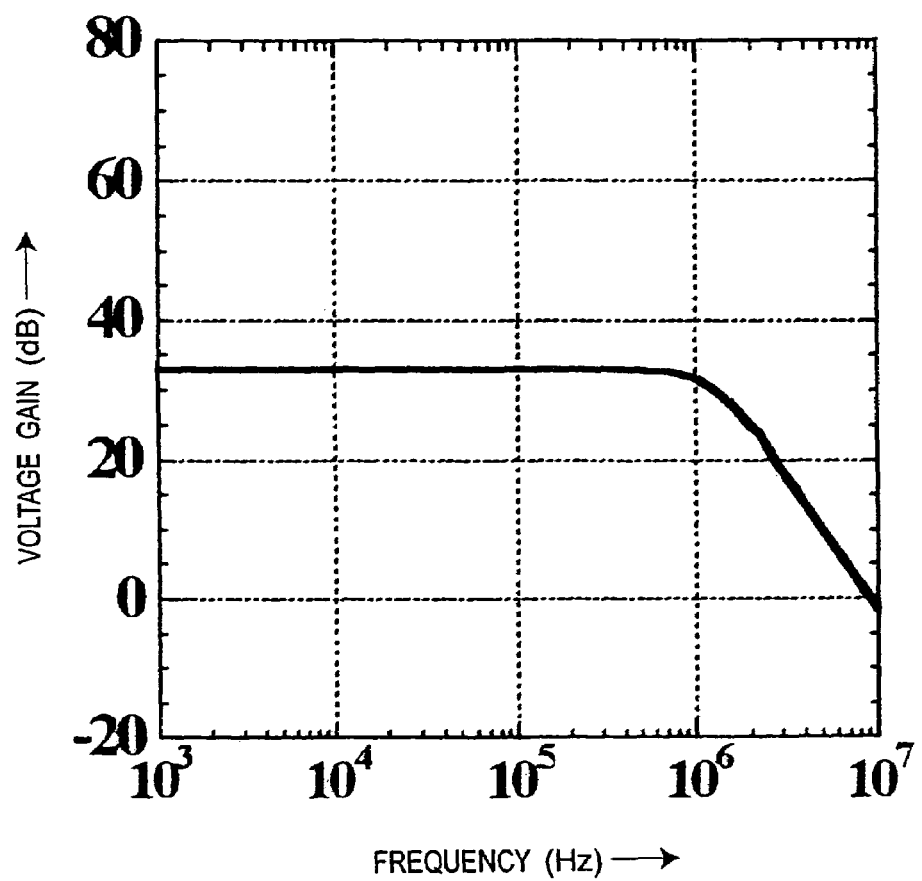
FIG. 10 is a graph showing a frequency characteristic of voltage gain in the low noise chopper amplifier circuit of FIG. 3.
Figure 11:
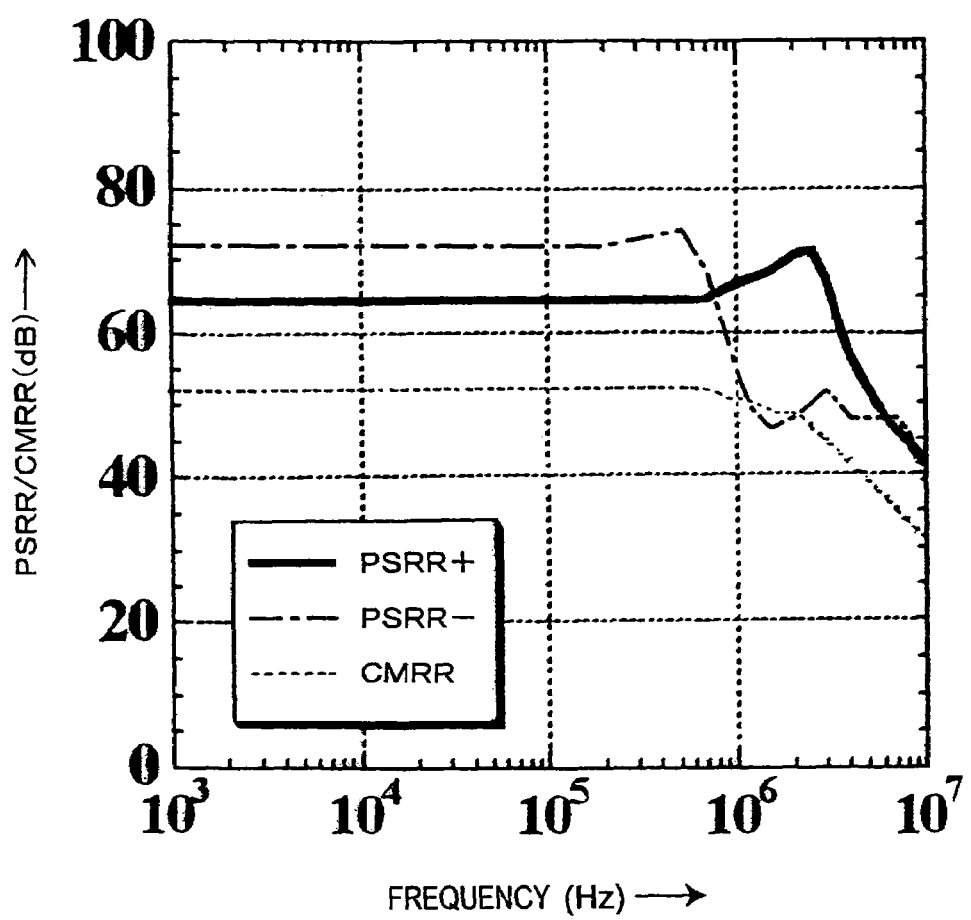
FIG. 11 is a diagram showing frequency characteristics of a positive-side power source rejection ratio (PSRR+), a negative-side power source rejection ratio (PSRR−), and a common mode rejection ratio (CMRR) of the low noise chopper amplifier circuit of FIG. 3.
Figure 13:
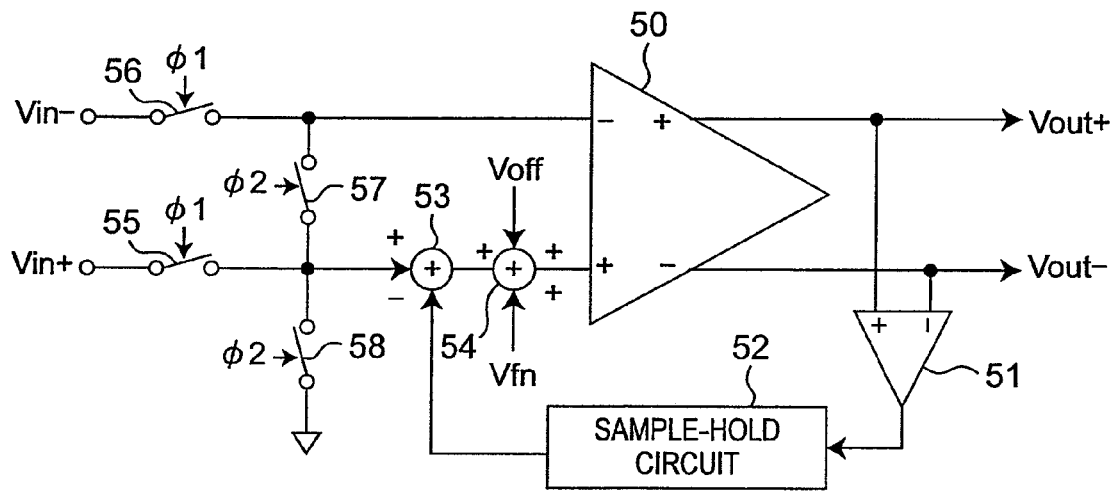
FIG. 13 is a circuit diagram showing a configuration of an operational amplifier circuit including an auto-zero operational circuit which is one of principles of noise reduction techniques according to a prior art.
Figure 14:
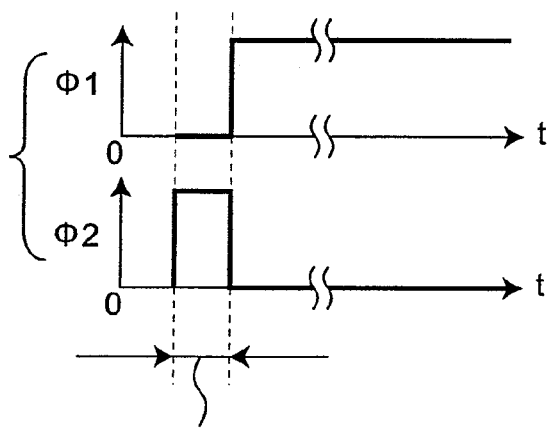
FIG. 14 is a timing chart showing control signals $\phi 1$ and $\phi 2$ for use in the operation amplifier circuit of FIG. 13 for offset cancellation.

FIG. 7 is a microscopic photograph showing a top surface of the chopper amplifier circuit of FIG. 3 formed on an IC chip. FIG. 8 is a graph showing output voltage waveforms in one case with neither chopping nor auto-zero operation applied and in another case with both chopping and auto-zero operation applied in the chopper amplifier circuit of FIG. 3. FIG. 9 is a graph showing a frequency characteristic of a power spectral density (PSD) of an input noise with only a switched operational amplifier (with no chopping and no auto-zero operation) for use in the chopper amplifier circuit of FIG. 3, and a frequency characteristic of a power spectral density (PSD) of an input noise in the chopper amplifier circuit (with chopping and auto-zero operation) stabilized by a chopper that operates using a chopping signal of 1 MHz. Further, FIG. 10 is a graph showing a frequency characteristic of voltage gain in the low noise chopper amplifier circuit of FIG. 3. FIG. 11 is a diagram showing frequency characteristics of a positive-side power source rejection ratio (PSRR+), a negative-side power source rejection ratio (PSRR−), and a common mode rejection ratio (CMRR) of the low noise chopper amplifier circuit of FIG. 3. The following description will be given with reference to FIGS. 7 to 11.

A photograph of a prototype chip of a differential chopper amplifier circuit according to this implemental example is shown in FIG. 7. A chip area of the amplifier circuit is 0.38× 0.54 mm². Among FIGS. 8 to 11 of measurement results, FIG. 8 shows output waveforms of the amplifier circuit with an input of a sinusoidal signal of 100 kHz and 8 mVp-p. It was confirmed by experiments that relative variations of the devices were able to be compensated by the auto-zero operation, with the result of reduced offset voltages. Whereas the offset voltage without the auto-zero operation was 270 mV, the offset voltage with the auto-zero operation performed was 3.3 mV, which was a reduction of 98%. For voltage reduction in amplifier circuits, the relative variations of the devices do matter seriously, causing a larger offset voltage. Further, since the effective output range also decreases with the lowered voltage, it is inevitably necessary to provide a contrivance for compensating the relative variations of the devices. It was demonstrated that the auto-zero system that employs the virtual grounding points proposed in the preferred embodiment and that does not require any floating analog switches is greatly effective for circuits that operating at a low voltage.

Input-equivalent noises of the switched operational amplifier 13 and the low noise amplifier circuit are shown in FIG. 9. The low noise amplifier circuit was subjected to a 5 μsec auto-zero operation and a chopping at 1 MHz. The input-equivalent noises of the switched operational amplifier 13 exhibit a typical flicker noise spectrum, including a noise spectrum of 1.45 μV/$\sqrt{\text{(Hz)}}$ at 100 kHz and an input-equivalent noise of 30.8 μV within a band region up to 100 kHz. In contrast to this, the low noise amplifier circuit exhibits low noise characteristics in low frequency regions, including 89 nV/$\sqrt{\text{(Hz)}}$ at 100 Hz and 15.9 μV within a band region up to 100 kHz, with a result of realization of a 49% reduction. Since noise in low frequency regions is predominantly thermal noise, there is a need for band limitation or the like for further noise reduction.

The measurement results of frequency characteristics of the voltage gain are shown in FIG. 10. As apparent from FIG. 10, results including a voltage gain of 32 dB, a cutoff frequency of 1.6 MHz, and a unity gain frequency of 13 MHz were obtained. Also, FIG. 11 shows measurement results of CMRR and PSRR, where a CMRR value of 57 dB, a PSRR+ value of 67 dB, and a PSRR− value of 71 dB were attained at 1 kHz.

FIG. 12 shows a list of a comparison in specifications of the low-voltage-operation low-noise amplifier circuit of FIG. 3 according to the present preferred embodiment with amplifier circuits specially intended for low noise and low voltage disclosed in prior art documents. Heretofore, there has been reported no low noise amplifier circuit this operates at 0.6 V, and the other amplifier circuits involve large power consumption. For evaluation of characteristics of amplifier circuits, FOM (Figure Of Merit) is defined as shown by the following equation:

$$FOM=1/(N\times P\times S) \qquad (3),$$

where "N" denotes a noise power, "P" denotes a power consumption, and "S" denotes a chip area. The FOM of the low noise amplifier circuit herein proposed is about 9 times as large as the FOM of each of the already published amplifier circuits (See, e.g., Non-Patent Documents 4, 8 and 9).

INDUSTRIAL APPLICABILITY

As described above, the feedback amplifier circuit according to the present invention includes a second capacitor which grounds a feedback point of the feedback circuit to block the DC voltage during an auto-zero operation interval and moreover accumulates and holds the offset voltage of the output terminal of the amplifier during the auto-zero operation interval, and thereafter cancels out the offset voltage of the input terminal of the amplifier by the accumulated and held offset voltage together with the first capacitor during an amplification interval subsequent to the auto-zero operation interval. Accordingly, the DC current can be blocked by the second capacitor, the operating points of the amplifier can be freely set, and further, the DC offset voltage at the input terminal of the amplifier can be canceled out during the auto-zero operation interval. Since any decrease in the DC offset voltage due to a leakage current can be compensated only by the second capacitor, the feedback amplifier circuit can be designed independent of the first capacitor of the feedback circuit. Further, since the voltage at the virtual grounding point (above-described feedback point) of the feedback circuit is grounded by the second switching device during the auto-zero interval, there occur neither on-resistances nor mismatch of clock feed-through. Thus, the influences of the DC offset voltage of the amplifier can be eliminated.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A feedback amplifier circuit comprising:
    an amplifier for amplifying an input signal and outputting an amplified signal;
    a first switching device for executing an auto-zero operation by inputting a signal outputted from the amplifier to an input terminal of the amplifier during an auto-zero operation interval prior to an amplification interval;
    a first capacitor provided in a feedback circuit interposed between an output terminal of the amplifier and the input terminal of the amplifier, the first capacitor accumulating and holding an offset voltage at the output terminal of the amplifier during the auto-zero operation interval, and then canceling an offset voltage at the input terminal of the amplifier by an accumulated and held offset voltage during an amplification interval subsequent to the auto-zero operation interval;
    a second switching device for grounding the feedback point of the feedback circuit during the auto-zero operation interval;
    a second capacitor inserted between the input terminal of the amplifier and the feedback point of the feedback circuit so as to be connected in series with the first capacitor, the second capacitor blocking a DC voltage, and accumulating and holding an offset voltage at an output terminal of the amplifier during the auto-zero operation interval, and thereafter cancelling an offset voltage at an input terminal of the amplifier by the offset voltage accumulated and held together with the first capacitor during an amplification interval subsequent to the auto-zero operation interval.

2. The feedback amplifier circuit as claimed in claim 1, further comprising an analog switch circuit connected at a feedback point of the feedback circuit, the analog switch circuit being turned on and off to constitute a switched capacitor during the amplification interval.

3. The feedback amplifier circuit as claimed in claim 1, further comprising:
    a first chopper modulator for chopper-modulating an input signal according to a predetermined control signal and outputting a chopper-modulated signal to the amplifier via the second capacitor;
    a chopper demodulator provided at a final stage of the amplifier, the chopper demodulator chopper-demodulating an amplified chopper-modulated signal according to the control signal and outputting a demodulated output signal; and
    a second chopper modulator inserted in the feedback circuit, the second chopper modulator chopper-modulating a demodulated signal outputted from the chopper demodulator according to the control signal and outputting a chopper-modulated signal to an input terminal of the amplifier via the second capacitor, thereby constituting a chopper amplifier circuit.

4. The feedback amplifier circuit as claimed in claim 1, further comprising a low-pass filter for passing therethrough an amplified input signal by low-pass-filtering an output signal outputted from the amplifier so as to pass therethrough a frequency band of the input signal.

5. The feedback amplifier circuit as claimed in claim 1,
    wherein the feedback amplifier circuit is constituted as a fully-differential amplifier circuit, and
    wherein the feedback amplifier circuit further comprises a common mode feedback circuit for generating a feedback signal fed back to the input terminal of the amplifier so that a level of the output signal outputted from the amplifier becomes a predetermined reference value in a common mode, based on an output signal outputted from the amplifier.

6. The feedback amplifier circuit as claimed in claim 1,
    wherein the feedback amplifier circuit is formed by a CMOS circuit.

* * * * *